US009704270B1

(12) United States Patent
Main et al.

(10) Patent No.: US 9,704,270 B1
(45) Date of Patent: Jul. 11, 2017

(54) METHOD AND APPARATUS FOR RASTERIZING AND ENCODING VECTOR GRAPHICS

(71) Applicant: Teradici Corporation, Burnaby (CA)

(72) Inventors: Ian Cameron Main, Vancouver (CA); David Victor Hobbs, Surrey (CA); Peter William Longhurst, Vancouver (CA)

(73) Assignee: Teradici Corporation, Burnaby, British Columbia (CA)

( * ) Notice: Subject to any disclaimer, the term of this patent is extended or adjusted under 35 U.S.C. 154(b) by 179 days.

(21) Appl. No.: 14/813,471

(22) Filed: Jul. 30, 2015

(51) Int. Cl.
| | | |
|---|---|---|
| *G06T 9/00* | (2006.01) | |
| *G06T 15/80* | (2011.01) | |
| *G06T 15/60* | (2006.01) | |
| *G06T 15/04* | (2011.01) | |
| *G06T 15/06* | (2011.01) | |
| *G06T 15/00* | (2011.01) | |
| *G06T 7/00* | (2017.01) | |

(52) U.S. Cl.
CPC ............. *G06T 9/00* (2013.01); *G06T 7/0081* (2013.01); *G06T 7/0085* (2013.01); *G06T 15/005* (2013.01); *G06T 15/04* (2013.01); *G06T 15/06* (2013.01); *G06T 15/60* (2013.01); *G06T 15/80* (2013.01)

(58) Field of Classification Search
CPC ....... G09G 2340/02; G09G 2340/0435; G09G 2350/00; H04N 19/132; H04N 9/8042; H04N 19/115; H04N 21/2402; H04N 19/146
See application file for complete search history.

(56) References Cited

U.S. PATENT DOCUMENTS

| | | | |
|---|---|---|---|
| 8,754,900 B2 | 6/2014 | Koneru et al. | |
| 8,803,876 B2 | 8/2014 | Bohan et al. | |
| 8,810,799 B2 | 8/2014 | Nishikawa | |
| 9,264,780 B1 * | 2/2016 | Stoica | H04L 67/1095 |
| 2013/0051768 A1 * | 2/2013 | Soroushian | H04N 9/80 386/248 |
| 2014/0085314 A1 | 3/2014 | Steinke | |
| 2014/0143297 A1 | 5/2014 | Ibarria | |
| 2016/0012795 A1 * | 1/2016 | Banski | G06F 3/14 345/520 |
| 2016/0173805 A1 * | 6/2016 | Claus | H04N 17/004 348/148 |
| 2016/0358381 A1 * | 12/2016 | Ui | G06T 9/00 |

FOREIGN PATENT DOCUMENTS

WO WO-2014/005301 A1 1/2014

OTHER PUBLICATIONS

Adrien Maglo, Ho Lee, Guillaume Lavoué, Christophe Mouton, Céline Hudelot, and Florent Dupont; "Remote scientific visualization of progressive 3D meshes with X3D"; 7 pgs.

* cited by examiner

*Primary Examiner* — Jeffrey Chow
(74) *Attorney, Agent, or Firm* — Moser Taboada

(57) ABSTRACT

The present invention describes exemplary embodiments of a method and apparatus for rasterizing and encoding vector graphics. The method comprises determining, by an image encoder, a difference between a transmission frame rate of an image encoder and a raster sequence frame rate of a raster sequence of images rasterized by a graphics processing unit (GPU); and adjusting, by the GPU, image detail of the raster sequence according to the difference.

20 Claims, 19 Drawing Sheets

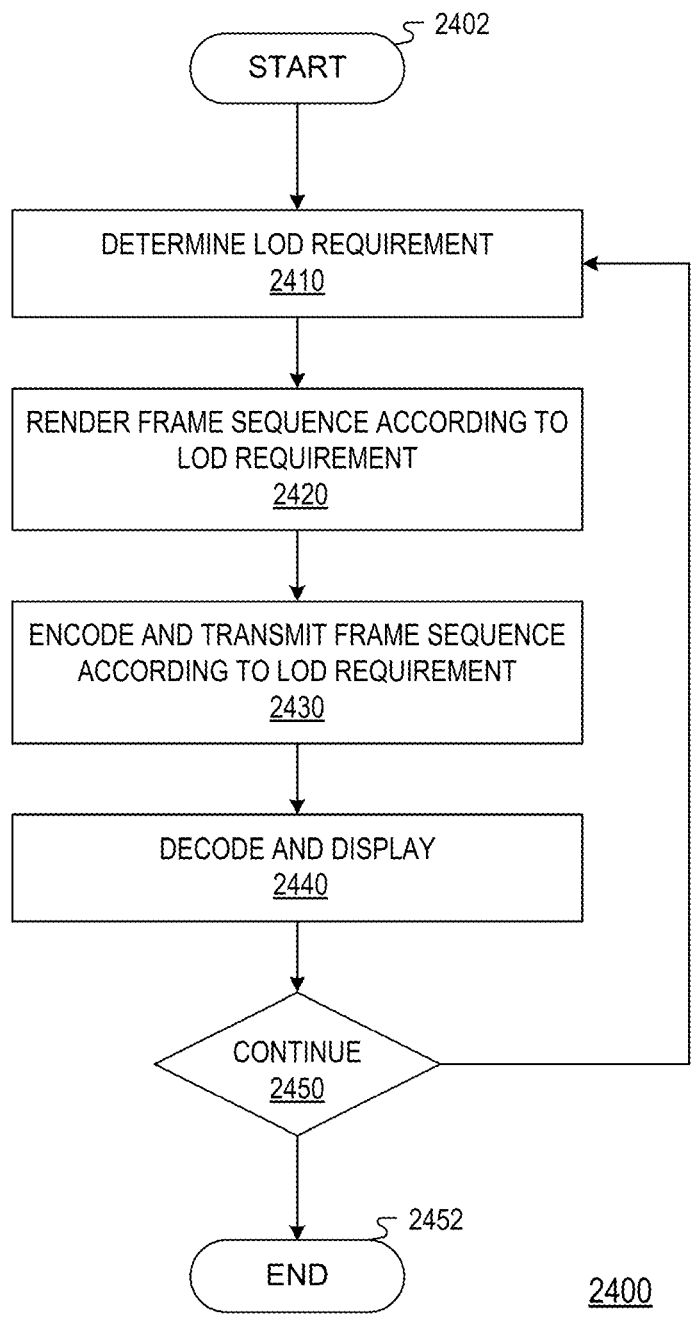

METHOD AND APPARATUS FOR
RASTERIZING AND ENCODING VECTOR
GRAPHICS

BACKGROUND OF THE INVENTION

Field of the Invention

Embodiments of the present invention relate generally to a method and apparatus for rasterizing and encoding vector graphics.

Description of the Related Art

Traditionally, graphics processing units (GPUs) have been deployed in personal computers (PCs) or workstations with direct coupling to local display resources to render image sequences at high frame rates. More recently however, GPUs have been deployed as centralized resources in corporate data centers and cloud infrastructure separated from client terminals by local area network (LAN) or wide area network (WAN) topologies. An image frame sequences rendered by the GPU is encoded, communicated over the network to the client terminal where it is decoded and displayed. One challenge with such a configuration is that many LAN and WAN networks have insufficient capacity to communicate the image frame sequence at the original rendered frame rate and acceptable quality. Rather, the frame sequence is decimated by encoding resources coupled to the GPU. Unless the GPU is throttled to render at the same frame rate of the encoded image frame sequence, this becomes highly inefficient for both central processing unit (CPU) and GPU resources, a problem exacerbated by virtualization of GPU and CPU resources in which power utilization is paramount. Some systems regulate the frame rate at the GPU by throttling the v-sync signal which provides course frame rate control but does not distinguish based on the content within the image sequence. While modern raster image encoders themselves are enabled to regulate image quality and frame rate based on the spatial frequency characteristics of content or characteristics of image motion, they too do not distinguish content importance beyond cursor location or position on a 2D display. The problem of efficiency is further exacerbated by computer-aided design (CAD) application software which in some cases, indiscriminately reduces the level of detail (LOD) of a 3D scene under motion to sustain a high rendering rate but resultant shaded surface artifacts are inefficient to encode and negatively impact throughput.

In a related field, some networked graphics systems use a client-server architecture in which rendering is decomposed into server and client functions and techniques such as progressive mesh transmission are deployed to overcome network bandwidth limitations. Such systems require client GPU resources for rendering and composition which detracts from the benefits of centralizing graphics processing in the datacenter.

Therefore, there is a need in the art for centralized GPU systems enabled to render, encode and transmit graphics content under resource constraint based on content characteristics.

SUMMARY OF THE INVENTION

Embodiments of the present invention generally relate to a method for rasterizing and encoding vector graphics. The method comprises determining, by an image encoder, a difference between a transmission frame rate of an image encoder and a raster sequence frame rate of a raster sequence of images rasterized by a graphics processing unit (GPU) and adjusting, by the GPU, image detail of the raster sequence according to the difference.

Another embodiment of the present invention relates to an apparatus for rasterizing and encoding vector graphics. In one embodiment, the apparatus comprises a graphics processing unit (GPU) that rasterized a raster sequence of images at a raster sequence frame rate and an image encoder coupled to the GPU by shared memory, the image encoder enabled to determine a difference between a transmission frame rate of an image encoder and the raster sequence frame rate, wherein the GPU adjusts the image detail of the raster sequence according to the difference.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 24 illustrates a process for displaying a rendered frame sequence based on dynamic LOD requirements submitted to a 3D application, graphics stack and/or an image encoder in accordance with exemplary embodiments.

DETAILED DESCRIPTION

The invention may be implemented in numerous ways, including as a process, an article of manufacture, an apparatus, a system, and as a set of computer-readable descriptions and/or instructions embedded on and/or in a computer-readable medium such as a computer-readable storage medium. In this specification, these implementations, or any other form that the invention may take, may be referred to as techniques. The Detailed Description provides an exposition of one or more embodiments of the invention that enable improvements in features such as performance, power utilization, cost, scalability, efficiency, and utility of use in the field identified above. The Detailed Description includes an Introduction to facilitate the more rapid understanding of the remainder of the Detailed Description. The invention encompasses all possible modifications and variations within the scope of the issued claims.

The term processor as used herein refers to any type of processor, central processing unit (CPU), microprocessor, microcontroller, embedded processor, media processor, graphics processor, or any other programmable device capable of executing and/or interpreting instructions in a form of software (such as microcode, firmware and/or programs).

The term software as used herein refers to any type of computer-executable instructions for any type of processor, such as programs, applications, scripts, drivers, operating systems, firmware, and microcode. Computer-executable instructions include any types of instructions performed by a processor, such as binary instructions that are directly performed, instructions that are translated and/or decoded prior to being performed, and instructions that are interpreted.

Introduction

Figure 1:
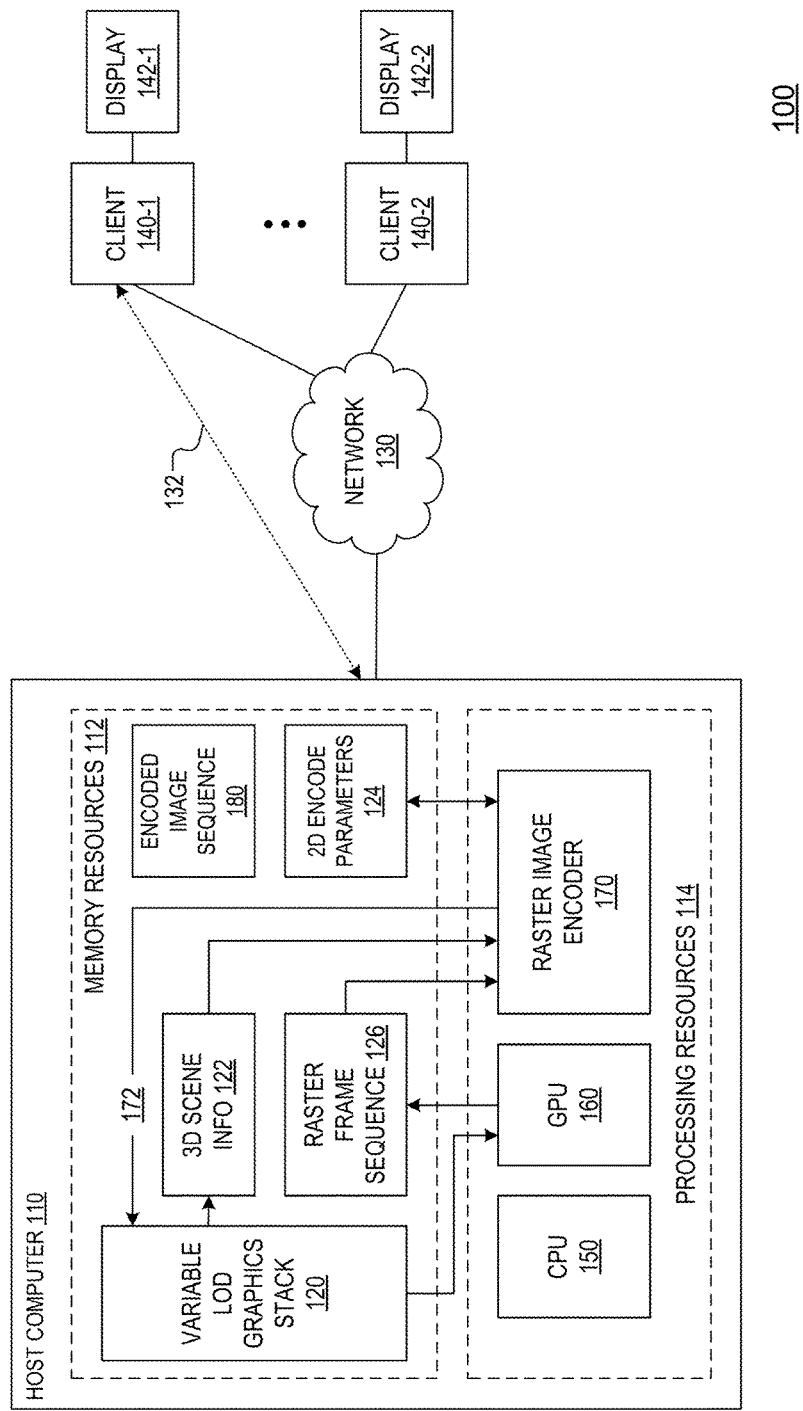
FIG. 1 illustrates selected details of an embodiment of a remote computing system for remote display of a raster frame sequence in accordance with exemplary embodiments.

In one or more embodiments of the present invention, a remote computing system, such as system 100 in FIG. 1, comprises a host computer coupled via a network to at least one client computer with a display. A graphics processing unit (GPU) on the host computer, in conjunction with variable level of detail (LOD) graphics software renders a sequence of 3D scenes (e.g. an interactive computer aided design [CAD] model or a 3D computer game) as a 2D raster frame sequence which is consumed by an image encoder for compression and transmission to the client computer. In an embodiment, the image encoder detects sub-optimal throughput of encoded frames transmitted to the client computer (e.g. due to CPU or network bandwidth constraint) and submits LOD requests to the graphics system which responds by adjusting the image detail of rendered frames including adjusting i) color LOD (number of colors present) ii) spatial LOD (e.g. mesh complexity) and/or iii) frame rate for low region of interest (ROI) areas within a frame. Wireframe images pertinent to CAD applications frames are compressed with increased efficiency using reduced spatial LOD image over high LOD image frames which improves throughput and/or uses less encoding resources whereas characteristically natural images benefit from increased LOD and improved anti-aliasing. In another embodiment, the graphics system provides 3D scene information to the image encoder which in turn adjusts the encoding quality and priority of identified regions based on 3D scene attributes such as focal significance and object depth. An object as defined herein is any set of shaded vertices. In another embodiment in which a single graphics system is tasked with servicing several 3D applications, each associated with a different image encoder (and corresponding client computer), a load balancer operates between each image encoder and the graphics system to optimize utilization of CPU, memory and network resources of the host computer.

FIG. 1 illustrates selected details of an embodiment of a remote computing system 100 ("system 100") for remote display of a raster frame sequence. System 100 comprises a host computer 110, such as a workstation computer, a computer server, or the like, coupled to and enabled to communicate with one or more communication endpoints, such as client computer 140-1 ("client 140") with a display 142-1, by an Internet Protocol (IP) packet network 130. In a virtualized environment such as a virtualized desktop infrastructure (VDI) or desktop-as-a-service (DaaS) deployment, system 100 comprises many client computers such as client 140-2 with a display 142-2 in communication with the host computer 110 via the network 130.

Host computer 110 ("computer 110") is, generally, a computer or system of computers with memory resources 112 and processing resources 114. The memory resources 112 comprise variable LOD graphics stack 120 ("graphics stack 120"), 3D scene information 122 and 2D encode parameters 124. The processing resources 114 comprise central processing unit (CPU) 150, graphics processing unit (GPU) 160 and raster image encoder 170 ("image encoder 170"). In some embodiments, the image encoder 170 is implemented as a hardware accelerator function such as part of an application specific integrated circuit (ASIC) or field programmable gate array (FPGA) with access to the memory 112. Such a hardware accelerator may comprise memory resources, image classification and encoding functions in addition to stream assembly functions for encoding and transmitting a compressed version of raster frame sequence 126 ("frame sequence" 126). In other embodiments, the image encoder 170 is implemented, at least in part, as a set of machine executable instructions stored in memory resources 112 and executed by the CPU 150.

The graphics stack 120 comprises application software such as Computer Aided Design (CAD) software, digital photo or video editing software, 3D games and the like coupled to graphics driver software via a 3D software application interface (API) such as DirectX or OpenGL and enabled to use the hardware rendering services of GPU 160. The GPU 160 generates the frame sequence 126 by executing draw commands issued by the graphics stack 120.

The image encoder 170 consumes the frame sequence 126 and generates an encoded image sequence 180 (such as encoded pixel updates to changed image frames) which are transmitted to the client computer 140 ("client 140"). In an embodiment, the image encoder 170 issues LOD adjustment requests 172 ("requests 172") to the graphics stack 120, for example as described for process 1000 herein.

The client 140-1, for example, connects to the host computer 110 by a remote desktop protocol 132 enabled for delivery of the native desktop or applications as encoded image sequence 180 via image encoder 170. The remote desktop protocol 132 also manages communications between host computer 110 and peripheral devices (e.g. audio devices, keyboard, mouse, joystick, USB devices and the like) attached to the client 140-1.

The network 130 comprises a communication system (e.g., the Internet, local area network (LAN), wireless LAN, wide area network (WAN), and the like) that connects computer systems completely by wire, cable, fiber optic, and/or wireless links facilitated by various types of well-known network elements, such as hubs, switches, routers, and the like. In one embodiment, the network 130 may be a shared packet switched network that employs various well-known protocols (e.g., TCP/IP, UDP/IP and the like) to communicate information amongst the network resources. For example, in various embodiments, the network 130 employs part of the Internet.

The client 140-1 is generally any type of computing device that can connect to network 130 and execute the client termination of the remote desktop protocol 132. For example, in an embodiment, client 140-1 is a terminal such as a zero client, thin client, personal computer, a digital signage device or tablet device. Client 140-1 typically comprises one or more peripheral devices such as a mouse, keyboard and display 142-1 for presenting a remote Graphical User Interface (GUI).

Figure 2:
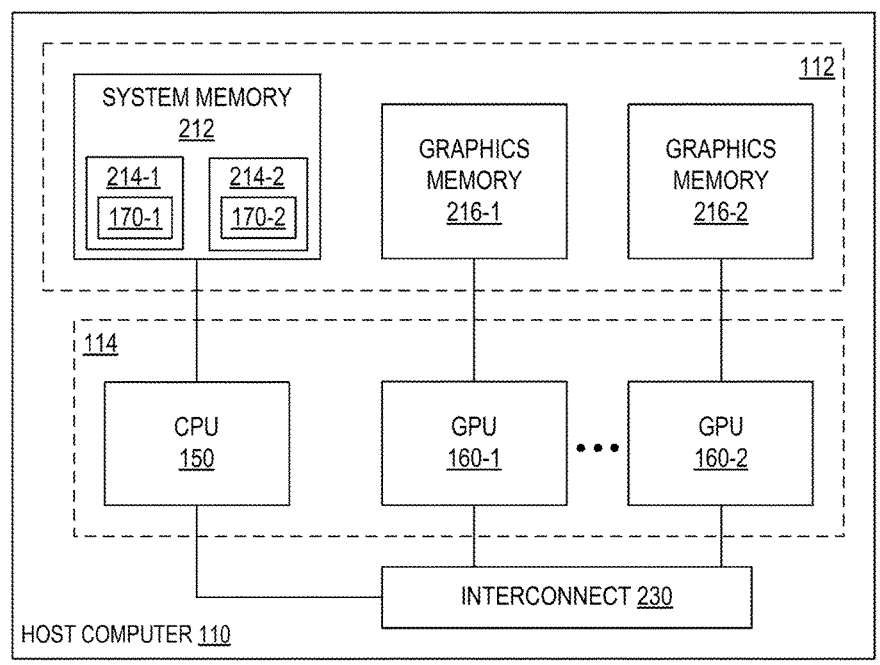
FIG. 2 illustrates selected details of a physical topology for a host computer comprising a plurality of virtualized image encoding resources in accordance with exemplary embodiments.

FIG. 2 illustrates selected details of a physical topology 200 for an embodiment of a host computer 110 comprising a plurality of virtualized image encoding resources in accordance with exemplary embodiments. An example of topology 200 is a virtualized server comprising virtual machines (VM) 214-1 and 214-2 in system memory 212. The virtual machine 214-1 comprises the image encoder 170-1 and the virtual machine 214-2 comprises the image encoder 170-2. Each virtual machine further comprises an operating system and a graphics stack 120 not shown. The physical topology 200 comprises a plurality of GPUs and associated graphics memory devices (shown as a GPU 160-1 coupled to graphics memory 216-1 and a GPU 160-2 coupled to graphics memory 216-2), the GPUs coupled to the CPU 150 and optionally clustered together by an interconnect 230 such as Peripheral Component Interconnect (PCI) Express (PCI-e) and/or proprietary interconnects such as NVLink from NVIDIA Corporation. In an embodiment, the GPU 160-1 comprises a virtualized graphics processing unit (VGPU) and the image encoders 170-1 and 170-2 are each associated with a distinct logical graphics processing pipeline, i.e. the GPU 160-1 generates distinct frame sequences 126 for each image encoder 170-1 and 170-2 which are stored in respective shared memory (i.e. typically regions of memory 212 shared between the VM 214 and the GPU 160). In another embodiment, the GPU 160-1 generates a raster frame sequence for the image encoder 170-1 and a different GPU 160-2 generates a distinct raster frame sequence for the image encoder 170-2.

Figure 3:
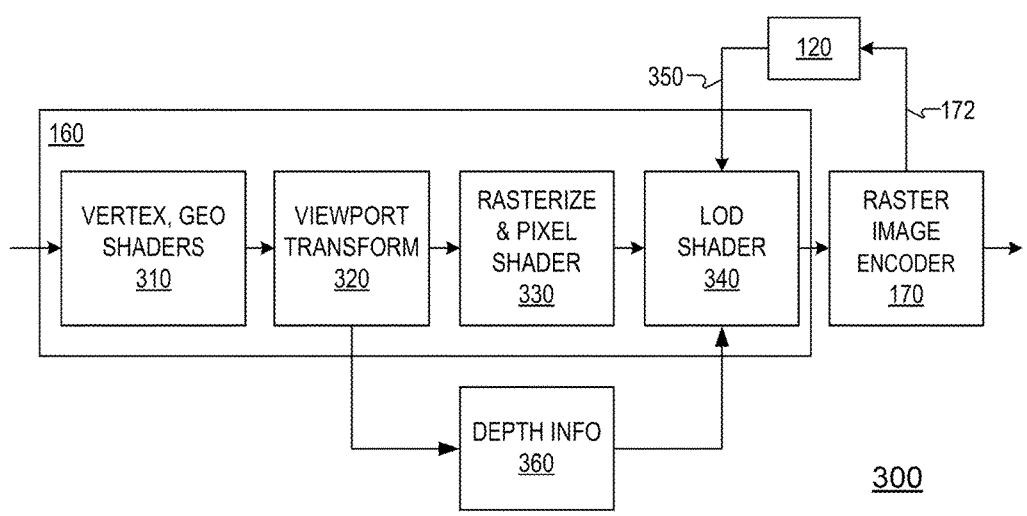
FIG. 3 illustrates selected details of a GPU comprising a graphics processing pipeline adapted for Level-of-Detail (LOD) shading in accordance with exemplary embodiments.

FIG. 3 illustrates selected details of the GPU 160 comprising a graphics processing pipeline 300 adapted for LOD shading in accordance with exemplary embodiments. The GPU 160 comprises the additional processing stage LOD shader 340. The GPU 160 comprises vertex and geometry shaders 310, viewport transform stage 320, rasterizer and pixel shader 330 (all generally known in the art of graphics processing), and LOD shader 340. In an embodiment, the LOD shader 340, which is coupled between the pixel shader and the image encoder 170, uses one or more image processing filters in conjunction with i) the corresponding 2D raster of pixels generated at pixel shader stage 330 and ii) the depth information 360 derived from the transform stage 320 to respond to requests 172. In an embodiment, pixel regions associated with background objects (i.e. increased depth) are subjected to visual smoothing (e.g. black-out), reduced color count, color keys, reduced contrast or reduced pixel update rates whereas pixel regions associated with foreground objects such as lines are subjected to increased color contrast. In another embodiment, the filter functions of LOD shader 340 are directed according to LOD discrimination co-ordinates 350 received from 3D application software or a rending engine. In some embodiments, LOD shader increases the contrast between a foreground line and a background surface as a precursor to lossy encoding.

In an alternative embodiment, some operations of LOD shader 340 are executed on 3D lines or primitives, for example mesh simplification, reduced LOD texture shading or reduced LOD fragment shading. Such LOD shader operations are executed between shaders 310 and viewport transform stage 320.

Figure 4:
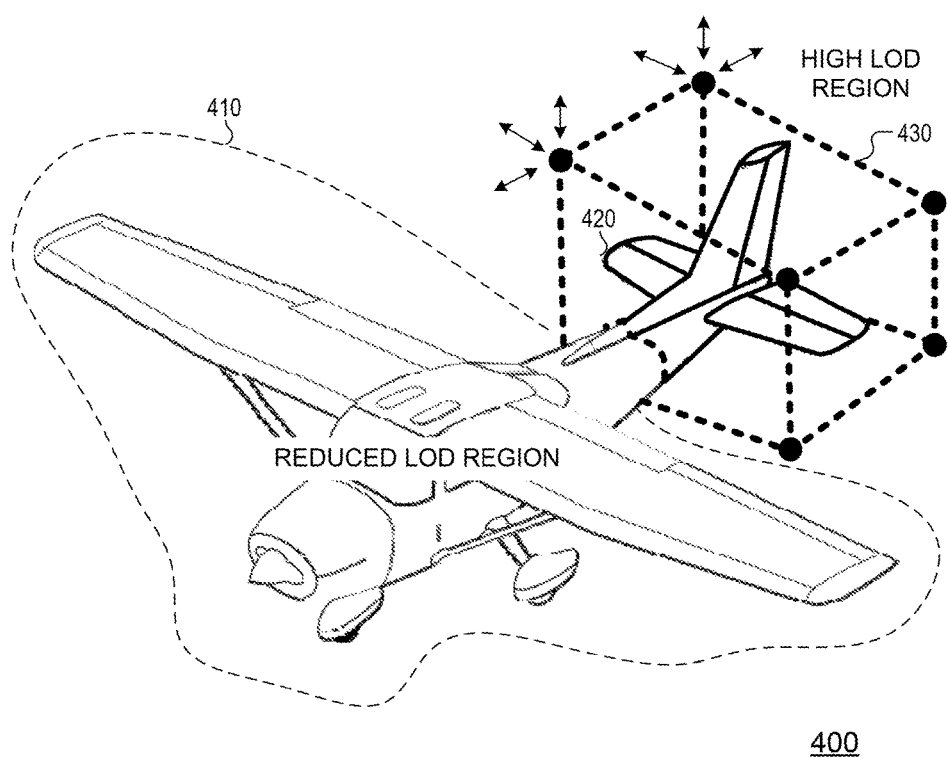
FIG. 4 illustrates an image of an exemplary Computer Aided Design (CAD) model as generated by engineering- or entertainment-oriented modeling software.

FIG. 4 illustrates an image of an exemplary CAD model 400 as generated by engineering- or entertainment-oriented modeling software for example. The model 400 comprises reduced LOD region 410 and high LOD region 420 which are differentiated by a secondary view frustum depicted as ROI adjustment frustum 430. In an embodiment, the ROI adjustment frustum 430 is activated by CAD modeling software (e.g. via a menu function) and displays two or more user-defined visual portions of a 3D model (e.g. via configurable Cartesian or polar co-ordinates). Visual portions of the CAD model are assigned different LOD values based on the real-time interactivity requirements. For example, a usage requirement may demand a field review of a model 400 from a tablet device over a WAN network (e.g. from a location with poor wireless reception, high latency, low available bandwidth and high packet loss) such that rendering the entire model at default image quality reduces frame rate by 90% and increases the interactive latency by 400% compared equivalent access to host computer 110 over a LAN network (e.g. high available bandwidth, low latency and low packet loss). By applying differentiated LOD specifications to the vertices of model 400 prior to visualization, the rendering functions of GPU 160 reduce the visual complexity of frame sequence 126 by applying techniques such as selective mesh simplification, selective viewport cropping or frame rate discrimination (e.g. region 410 is rendered at a reduced frame rate compared to region 420). Alternatively, dimensional information for ROI adjustment frustum 430 (and optionally additional ROI frustum for other regions) is forwarded to LOD shader 340 as LOD discrimination co-ordinates 350 or to image encoder 170 in conjunction with explicit pixel depth information. In another embodiment, a high LOD region is differentiated from a low LOD region in 2D image display space by a visual overlay generated by host application software or a software service at client 140. The coordinates for such a visual overlay are communicated to either i) the application software to differentiate visual complexity or frame rate ii) the graphics stack 120 to differentiate visual complexity or frame rate or iii) the image encoder 170 to differentiate image quality or frame rate.

Figure 5:
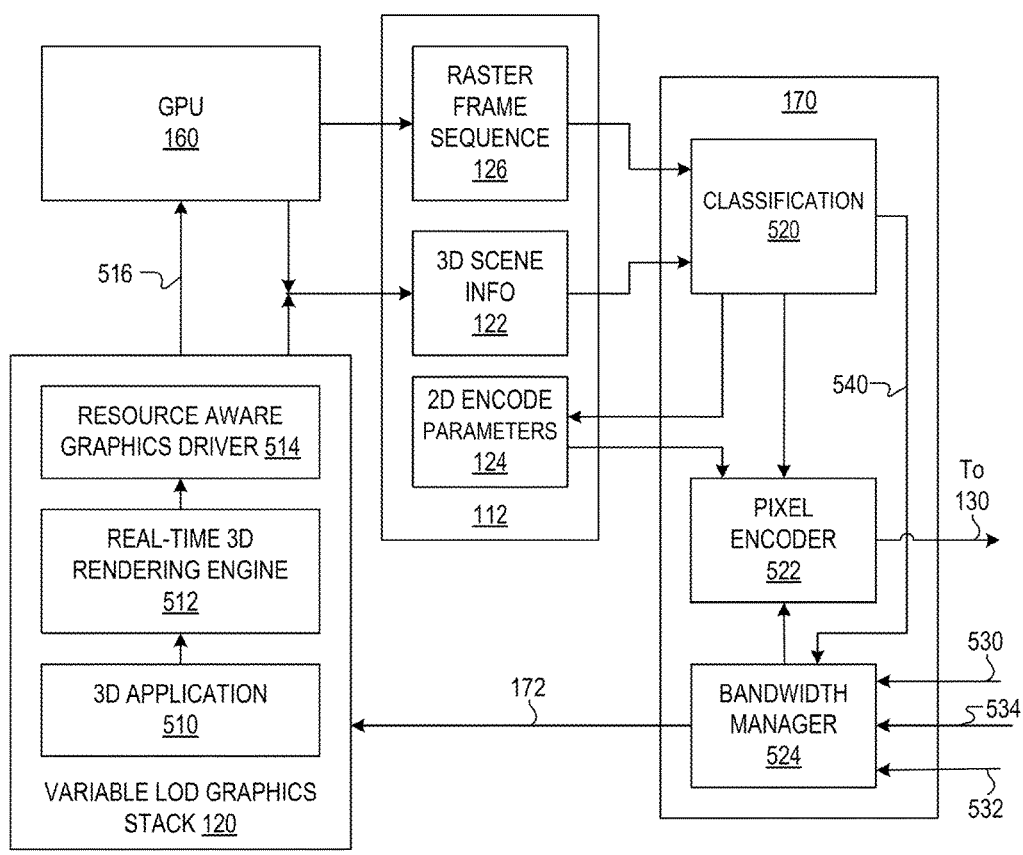
FIG. 5 illustrates selective functional blocks and data structures of a graphics stack and GPU coupled to an image encoder via shared memory such that the graphics stack is enabled to receive LOD requests from the image encoder and the image encoder is enabled to receive 3D scene information from the GPU in accordance with exemplary embodiments.

FIG. 5 illustrates select functional blocks and data structures of a graphics stack 120 and GPU 160 coupled to an image encoder 170 via shared memory such that the graphics stack 120 is enabled to receive requests 172 from the image encoder 170 and the image encoder 170 is enabled to receive 3D scene information from the GPU in accordance with exemplary embodiments. In an embodiment, a region of memory resources 112 is designated as a shared frame buffer that stores ephemeral raster frame sequence 126 which couples the rendering process of graphics stack 120 and GPU 160 to the encoding process of image encoder 170.

The graphics stack 120 comprises a 3D application 510 which interacts with a real-time 3D rendering engine 512, sometimes called a "3D engine" 512. 3D Engine 512 provides platform abstraction, timing, physics, animation services and the like for the 3D application 510. In some embodiments, some such functions are incorporated into the 3D application itself in which case the 3D application 510 interacts with the resource aware graphics driver 514 ("graphics driver 514") and no 3D engine is required.

In an embodiment, the graphics driver 514 provides a software abstraction of GPU 160 via a resource-aware API to 3D application 510 and/or 3D engine 512. In such an embodiment, the graphics driver 514 responds to requests 172 by adjusting parameters used by rendering methods (e.g. adjusted anti-aliasing parameters, adjusted shading parameters or adjusted mesh complexity), such that application 510 and/or 3D engine 512 are resource-agnostic i.e. in such an embodiment, there is no necessary interface between requests 172 and the application 510 and/or 3D engine 512. In another embodiment, a resource-aware 3D application 510 or resource-aware 3D engine 512 adjusts rendering methods at the application layer based on requests 172 and communicates with an underlying resource-agnostic graphics driver 514 via a generic graphics API i.e. in such an embodiment, there is no necessary interface between requests 172 and the graphics driver 514. The graphics driver 514 issues draw commands 516 to the GPU 160 which, in an embodiment may comprise commands directed at the LOD shader 340, for example using a graphics API extension library such as an extension to the OpenGL API.

Figure 6:
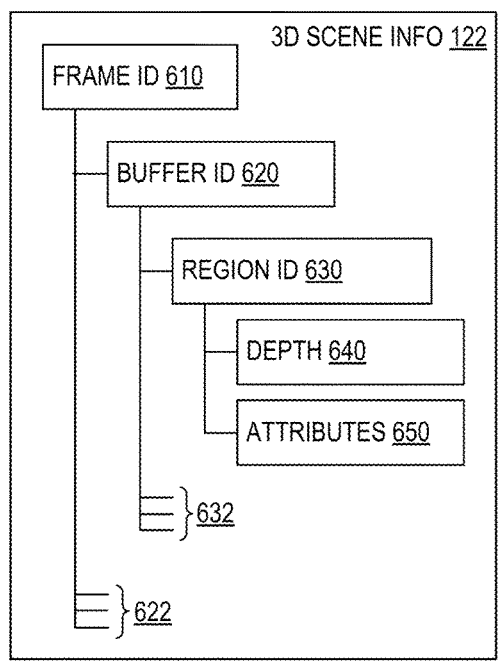
FIG. 6 illustrates a data structure comprising 3D scene information in accordance with exemplary embodiments.

The GPU 160 renders a frame sequence, typically into local graphics memory 216 from where it is copied (e.g. via a Direct Memory Access (DMA) function) to memory 212 as frame sequence 126. In different embodiments, frame sequence 126 may be stored i) as a single 2D frame buffer, ii) as a circular set of 2D frame buffers iii) an Red-Green-Blue-Alpha (RGBA) image buffer in which the alpha color channel ("alpha channel") is used as a 3D scene information mask iii) a set of decomposed 2D image buffers such as a natural image buffer and an overlay text image buffer or additional overlay buffers such as a menu buffer (for a rasterized menu image) or a high contrast object buffer for foreground rendered high contrast objects such as foreground lines of a wireframe CAD drawing or iv) circular set of decomposed 2D image buffers, each set associated with a different raster update rate e.g. a first set comprising one or more frame buffers associated with a rendered background scene and a second set comprising a plurality of frame buffers associated a rapid moving foreground overlay image. The GPU 160 periodically updates 3D scene information 122 based on updated attributes of recently rasterized regions. An embodiment of the 3D scene information is depicted in FIG. 6.

Figure 7:
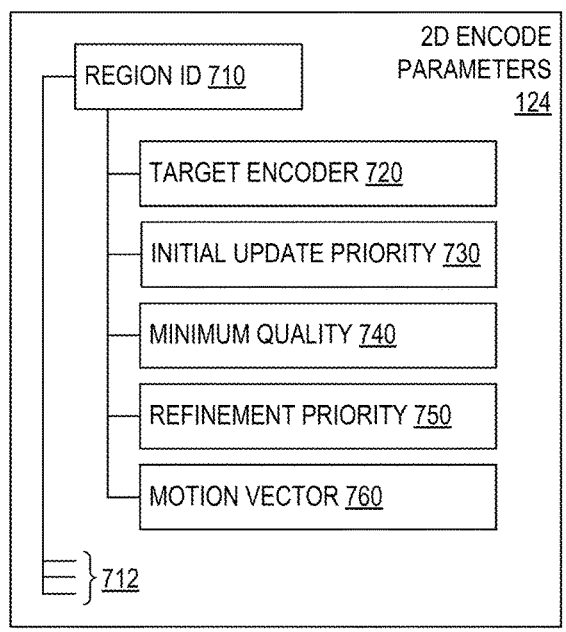
FIG. 7 illustrates a data structure comprising 2D encode parameters in accordance with exemplary embodiments.

The classification function 520 consumes frame sequence 126 by identifying the most recently rendered frame as the candidate for encoding, and classifying recently changed pixels based on pixel or regional attributes read from the 3D scene information 122. The classification function 520 generates the 2D encode parameters 124 which specify pixel-based or regional encoding parameters such as image type (e.g. text type, line art, natural image, high contrast object or video image), encoding quality level and encoding priority based in part on the 3D scene information 122. In some embodiments at least part of the classification function 520 is executed by the GPU 160 in which case the 2D encoding parameters 124 are also generated at least in part by the GPU 160. An embodiment of 2D encoding parameters 124 is depicted in FIG. 7.

In an embodiment, the pixel encoder 522 comprises a set of raster image encoder services, each optimized for compression and encoding of a different image content type. For example, a lossless encoder may be designated for encoding rasterized text, line art and high contrast object, a wavelet or Discrete Fourier Transform (DCT) encoder may be designated for quantizing and encoding natural images and a video encoder such as an H.264 encoder may be designated for encoding video regions. In another embodiment, the pixel encoder 522 comprises a programmable video encoder, e.g. high efficiency video coding (HEVC) variant, enabled to encoder different image regions at specified update rates and specified image qualities across a broad spectrum from high color compression (e.g. YUV 4:2:0) to lossless conversion (e.g. YUV 4:4:4).

The bandwidth manager 524 manages the encoding priority and transmission rate for packets of encoded pixels generated by pixel encoder 522. Image frame encoding and transmission onto network 130 is regulated to a rate determined by resource constraint estimates including: i) network bandwidth estimate 530 based for example on historic network utilization and packet loss information, ii) client CPU constraint information 532 received from client 140 and iii) host CPU constraint information 534 received from CPU 150. In the event of a resource constraint such as a network bandwidth constraint or a client CPU processing constraint manifested as a difference between the frame update rate 540 of frame sequence 126 (as determined by the classification function 520 or presented by GPU 160) and the frame update rate at the output of pixel encoder 522 in conjunction with a high per-frame encoding cost, the bandwidth manager 524 submits LOD requests to the graphics stack 120 which, in different embodiments are serviced by 3D application 510, 3D engine 512 or graphics driver 514. In some embodiments, LOD requests are generated in event of a host CPU processing constraint which are used by graphics stack to decrease CPU resource utilization (e.g. reduced frame rate for rendering engine 512) or increase the LOD in some cases where, for example i) graphics stack 120 is determined as an insignificant contributor to host CPU utilization or ii) increased LOD improves network bandwidth utilization e.g. improved anti-alias filtering such as multi-frame sampled anti-aliasing (MFAA) of a rendered scene or smoother images resultant from increased mesh complexity.

FIG. 6 illustrates a data structure comprising 3D scene information 122 in accordance with exemplary embodiments. A particular frame in sequence 126 is identified by frame ID 610. The frame may comprise one buffer identified by buffer ID 620 and optionally additional buffers ID's 622 related to additional buffers. For example, a frame might comprise multiple buffers associated with a set of base images, image overlays, vertex or primitive information, and/or screen font descriptors for the identified frame such as a background scene rendering in a first buffer and a high contrast overlay in a second buffer. In some embodiments, a particular buffer may be designated for transfer to the client in pre-composited format (e.g. vertices, primitives or fragments) for client-side rendering and/or composition, for example as determined by a process 2200. A particular buffer is segmented into regions identified by region ID 630 and additional region ID's 632, each region comprising a set of pixels for partial candidate frame. A region may be identified by the 2D coordinates of an individual pixel or origin coordinates for a block of pixels or alternatively defined region such as a set of co-ordinates defining a polygon. In an embodiment, specified regions each comprise depth information 640 and attributes 650. The depth information 640 specifies the distance of the rendered object associated with the raster region, for example as a scalar distance from the near clipping plane or in less granular terms (e.g. foreground or background), as might be determined during the viewport transform step of graphics processing. In an embodiment, depth information 640 further comprises a size parameter such as a bounding volume metric for the related object in the 3D scene which enables encoding parameters to be biased according to both object size and object depth.

The attributes 650 for a specified region may include one or more of several attributes that further characterize the region to aid resource optimization during pixel encoding. Table 1 illustrates such a set of attributes and corresponding parameter descriptions:

TABLE 1

| ATTRIBUTE | PARAMETER DESCRIPTIONS |
| --- | --- |
| Content Descriptor | Text |
| | Wireframe |
| | Natural |
| | Terrain |
| | Backdrop |
| | Motion blur |
| | Reflection |
| | Shadow |
| | Ephemeral object |
| Velocity | Speed hints |
| Motion Hints | Content coordinates in previous frame |
| | Camera movement hints |
| Perspective | Content surface normal |
| Region of Interest | Content ROI Ranking |

TABLE 1-continued

| ATTRIBUTE | PARAMETER DESCRIPTIONS |
| --- | --- |
| Synchronization | ID List for related content |
| Change Mask | Unchanged pixel mask |
| Scene Change Info | Scene start and end markers |
| Frame Rate | Content update rate hints |

In an embodiment, the attributes 650 are used to generate 2D encode parameters 124 as described in process 1400. In embodiment in which GPU 160 renders a frame as a 2D base image and set of overlay images, 3D scene information 122 may include an occlusion mask or color key value that specifies content known to be occluded by overlay layers i.e. primitives are rendered on an overlay layer and the corresponding occluded pixels in the base layer are color keyed which indicates 'don't care' regions to image encoder 170 when a particular layer is encoded.

FIG. 7 illustrates a data structure comprising 2D encode parameters 124. When a particular frame in sequence 126 is identified as comprising changed pixels designated for encoding, 2D encode parameters 124 are generated by classification function 520 from 3D scene information 122 for the corresponding frame. Process 1400 describes such a process for classifying image regions and setting 2D encoding parameters.

Region ID 710 specifies a 2D region which in different embodiments either corresponds directly with the co-ordinates of region ID 630 or comprises derivative co-ordinates. Additional region IDs 712 of the particular frame each specify additional corresponding encode hints. Region ID 710 may further specify whether or not the region has changed subsequent to encoding in a prior frame of sequence 126 which allows pixel encoder 522 to skip unchanged regions. Target encoder 720 specifies a designated encoder service of pixel encoder 522 such as a lossless encoding service or one of several lossy encoding services (e.g. DCT or wavelet encoder, decimation encoder, cached color palette encoder) based on region depth 640 and attributes 650. Initial update priority value 730 regulates the encoding update interval (i.e. inverse of frame rate) for a region that has changed since prior encoding based on region attributes 650. In the case of a specified lossy encoding service, minimum quality value 740 specifies the minimum image quality (e.g. image quantization level) for a region based on depth 640 and region attributes 650. If pixel encoder 522 comprises progressive refinement services, refinement priority parameter 750 regulates the rate at which an encoded region is improved in quality from the minimum quality level to a higher quality level based on region attributes 650. Motion vector 760 is derived from motion attributes 650 provided by the GPU 160 or graphics stack 120.

Figure 8:
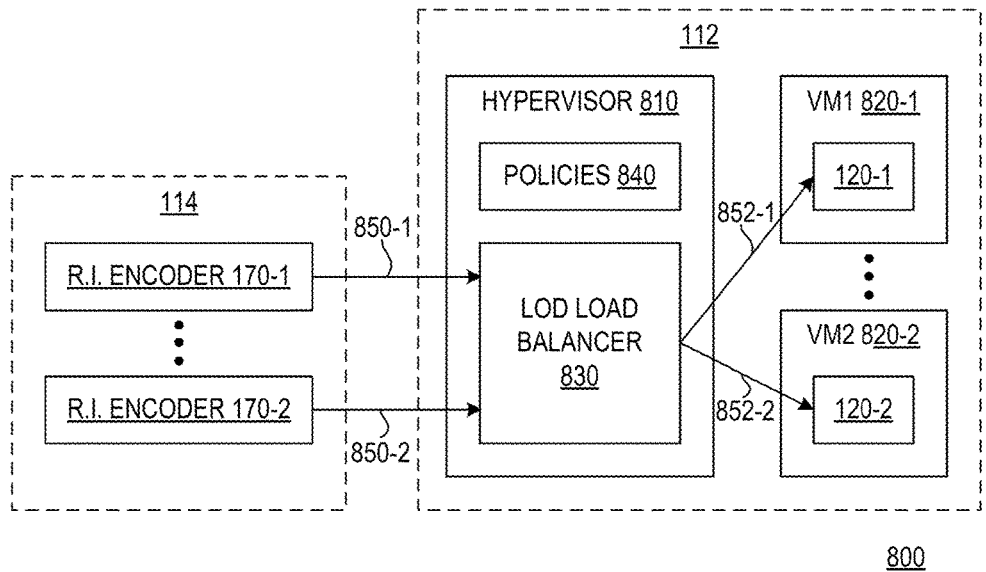
FIG. 8 illustrates virtualized graphics system comprising a plurality of raster image encoders, each associated with a corresponding graphics stack in independent virtual machines in accordance with exemplary embodiments.

FIG. 8 illustrates virtualized graphics system 800 comprising a plurality of raster image encoders 170-1 and 170-2, each associated with a corresponding graphics stack 120-1 and 120-2 in independent virtual machines 820-1 and 820-2. The virtual machines (collectively virtual machines 820) are supported by a hypervisor 810 such as ESX from VMWARE Corporation, HYPER-V from MICROSOFT Corporation or a variant of XENSERVER. The raster image encoders 170-1 and 170-2 may comprise machine executable instructions or be implemented, at least in part, as hardware accelerated functions on an FPGA or ASIC. In an embodiment, each virtual machine 820 and corresponding raster image encoder 170 is associated with a different remote computing session to a different client computer (e.g. VM 820-1 associated with client 140-1 and VM 820-2 associated with client 140-2). In an alternative server 'session host' embodiment not shown, graphics stacks 120-1 and 120-2 are executed in the same VM 820-1 and each graphics stack is associated with the functions of a unique raster image encoder 170-1 or 170-2.

The raster image encoder 170-1 issues LOD requests 850-1 and the raster image encoder 170-2 issues LOD requests 850-2 to the LOD load balancer 830 which adjusts the LOD requests according to administrative policies 840 and real-time awareness of aggregate resource availability of the host computer including CPU, GPU, memory and network bandwidth resources. Render quality adjustment requests 852-1 and 852-2 are issued to graphics stack 120-1 and 120-2 respectively. As an example, encoders 170-1 and 170-2 might each simultaneously request increased LOD or frame rate due to an apparent increase in network availability. However, load balancer 830 determines that such an increase in LOD or frame rate is unattainable for both graphics stacks 120-1 and 120-2 due to a CPU or memory bandwidth bottleneck, where after load balancer 830 issues policy-based weighted LOD requests to the respective graphics stacks 120.

Figure 9:
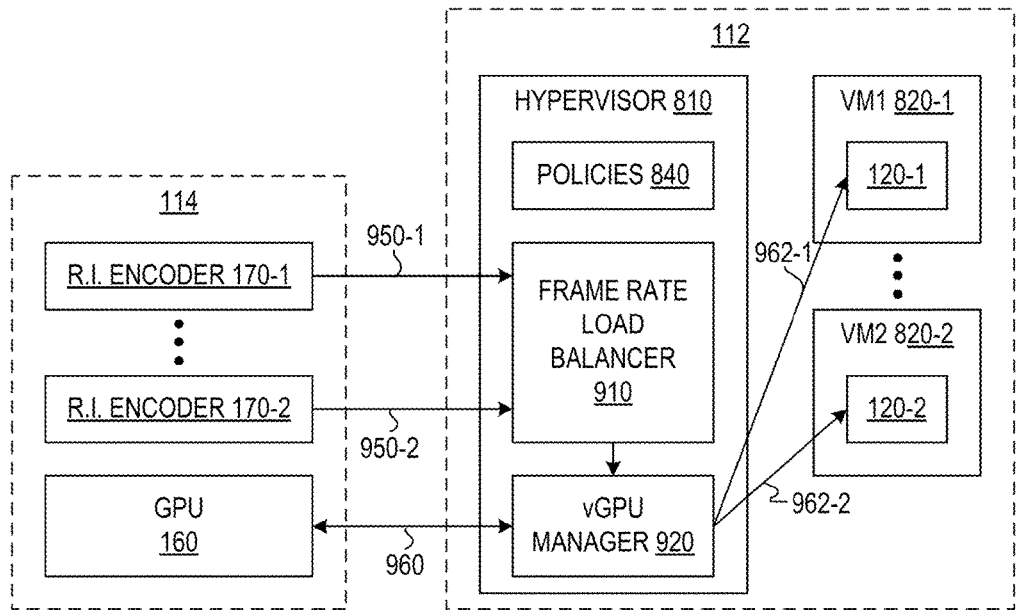
FIG. 9 illustrates virtualized graphics system comprising a frame rate load balancer in communication with a virtualized GPU ("vGPU") manager in accordance with exemplary embodiments.

FIG. 9 illustrates a virtualized graphics system 900 comprising a frame rate load balancer 910 in communication with a virtualized GPU ("vGPU") manager 920 in accordance with exemplary embodiments. In an embodiment, the vGPU manager 920 is the component of a graphics stack 120 that resides in the hypervisor 810 and provides physical management services for the GPU 160 which is shared amongst the graphics stacks 120. In such an embodiment, the GPU 160 may comprise independent draw command queues for each independent graphics stack 120. The GPU 160 or the vGPU manager 920 regulates independent render rates of the graphics stacks 120-1 and 120-2 by emulating a well-known synchronization signal such as "v-sync" or Frame Rate Limiter (FRL).

The raster image encoder 170-1 issues frame rate requests 950-1 and the raster image encoder 170-2 issues frame rate requests 950-2 to the frame rate load balancer 910 which adjusts the frame rate requests according to administrative policies 840 and real-time awareness of aggregate resource availability of the host computer including CPU, GPU, memory and network bandwidth resources. Adjusted frame rate requests are submitted to the vGPU manager 920 which are either communicated to the GPU as requests 960 (following which the GPU 160 adjusts frame synchronization rate) or the vGPU manager 920 provides the adjusted frame synchronization rate 962-1 and 962-2 to the graphics stack 120-1 and 120-2 respectively. As an example, raster image encoder 170-1 may be associated with a client computer 140-1 of limited processing capability or limited network bandwidth availability based on a temporary resource constraint. In such a case, raster image encoder 170-1 issues frame rate request 950-1 to frame rate load balancer 910, following which frame synchronization rate 962-1 is decreased accordingly. In a power saving embodiment (e.g. as specified via administrative policies), aggregate resource utilization is reduced e.g. the frame synchronization rate is maintained at its prior reduced value and overall system power consumption is reduced based on the reduced render rate of graphics stack 120-1. In a performance-oriented embodiment (e.g. as specified via administrative policies), aggregate resource utilization is sustained. For example i) the frame synchronization rate 962-2 is increased in proportion to the corresponding reduction of frame synchronization rate 962-1, ii) additional graphics processing for graphics stack 120-2 in enabled or iii) graphics processing for other graphics stacks are enabled or migrated to GPU 160.

Figure 10:
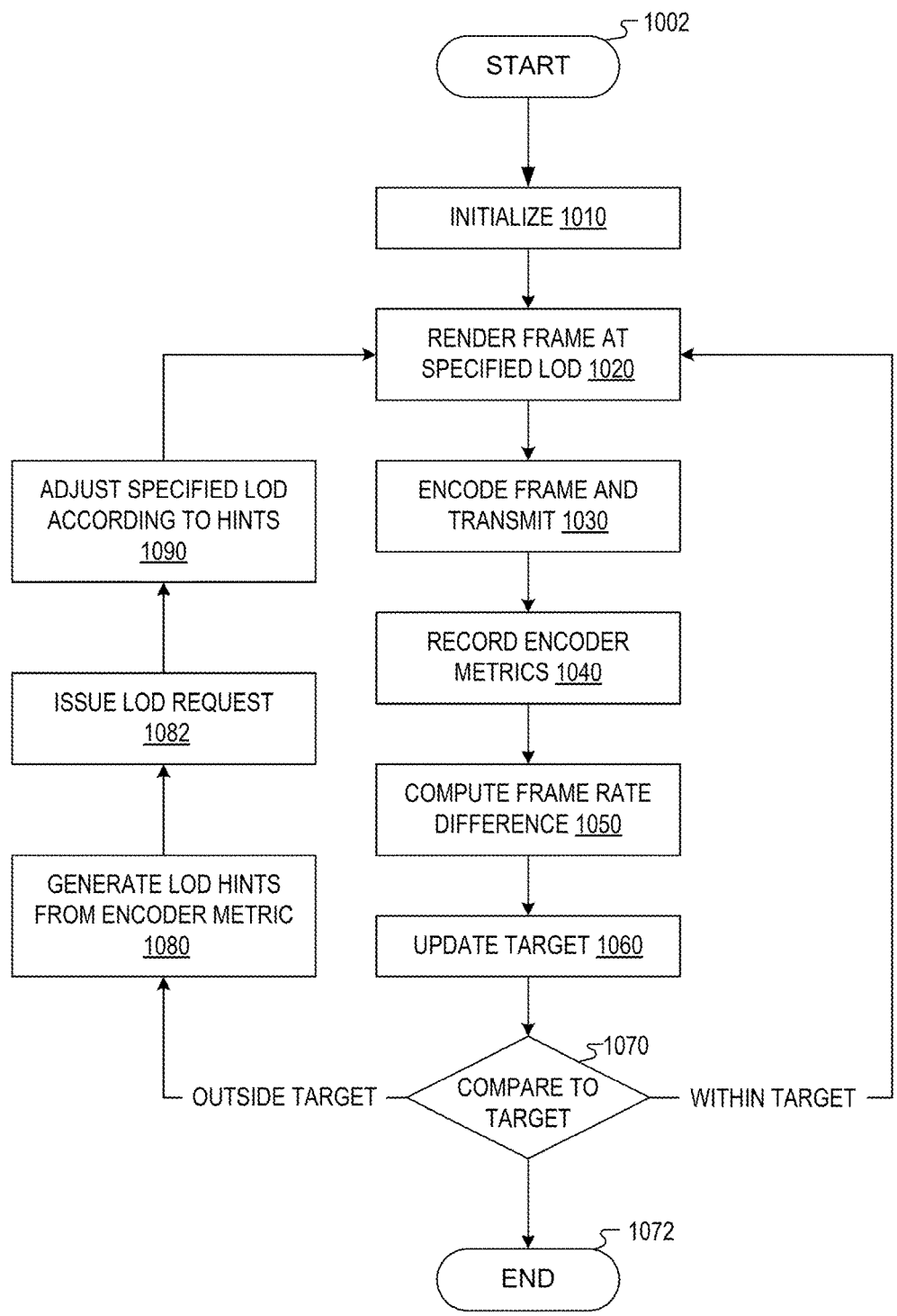
FIG. 10 illustrates a process executed by processing resources for rendering, encoding and transmitting a frame sequence in accordance with exemplary embodiments.

FIG. 10 illustrates a process 1000 executed by processing resources 114 for rendering, encoding and transmitting a frame sequence 126 when, under resource constraint, an image encoder 170 submits LOD requests to a graphics stack 120 to improve the encoded frame rate for the raster frame sequence, in accordance with exemplary embodiments of the present invention.

Process 1000 begins at step 1002 ("Start") and proceeds to step 1010 ("Initialize") in which configurable render settings of a graphics stack 120 are initialized, for example using default LOD parameters, anti-aliasing settings, lighting, textures and rear clipping planes for objects associated with a prospective 3D image scene. In an embodiment, resource availability is predicted or tested and historic LOD parameters are loaded that match the anticipated resource availability. For example, when a remote desktop connection is established with a client over a WAN connection of previously characterized bandwidth constraint, anti-aliasing filters for line art primitives may be disabled and models of background objects initialized to a reduced LOD. Additionally, at step 1010 a target value or target profile for the difference between the rendered frame rate of the raster frame sequence 126 and the encoded frame rate is set and different target profiles may be applied based on one or more of i) WAN topology, ii) client capabilities, iii) host computer resource policies iv) resolution of the rendered frame sequence and v) workload characteristics (e.g. wireframe CAD model, interactive architectural model or computer game). For example, a target profile associated with a wireframe CAD model accessed from a 1024×768 resolution tablet device over a 5 Mbps WAN connection may specify that the encoded frame rate should maintain at least 15 encoded frames per second for raster frame rates above 20 frames per second, otherwise the encoded frames rate should maintain at least 75% of the raster frame rate for raster frame rates below 20 frames per second in order to ensure satisfactory user interactivity between a user and a CAD model.

Process 1000 proceeds to step 1020 ("Render Frame at Specified LOD") in which the LOD specifications determined at step 1010 or step 1080 are used to render the next frame. Process 1000 proceeds to step 1030 ("Encode Frame and Transmit") in which the frame rendered at step 1020 is consumed by an image encoder 170 for encoding and transmission to client 140. In one embodiment, the raster frame is transferred to shared memory accessible to the image encoder. In another embodiment, the image is rendered directly to memory accessible by the image encoder 170. Process 1000 proceeds to step 1040 ("Record Encoder Metrics") in which metrics such as compression ratio, e.g. encoded bits per pixel (bpp), and compression efficiency (e.g. clock cycles per pixel or pixels per second) are recorded for the encoded image frame, for example on a per-pixel or macroblock region basis. In an embodiment in which image encoder 170 comprises distinct content-dependent encoding services such as a lossless encoding function for high contrast regions and one or more lossy encoding functions for characteristically natural image regions or video content, the target encoder processing function for a pixel, block or region is recorded.

Process 1000 proceeds to step 1050 ("Compute Frame Rate Difference") in which the difference between the frame rate of the raster sequence generated by the GPU 160 (as calculated by the GPU 160, the graphics stack 120 or a classification function 520) and the encoded image update rate (as determined by the pixel encoder 522 or the client 140) is determined.

Process 1000 proceeds to step 1060 ("Update Target") where the target profile specified at step 1010 is adjusted in the event of a policy change or a resource change (e.g. a network change) that demands either increased or decreased assertion of LOD requests. Process 1000 proceeds to step 1070 ("Compare to Target"), where, if it is determined that the encoded frame rate is within a target range of the rendered frame rate as specified at step 1060, process 1000 returns to step 1020, else if the encoded frame rate is outside the target range, process 1000 proceeds to step 1080. In an alternative embodiment of step 1070, the CPU utilization of host computer 110 is compared to a target profile and process 1000 proceeds to step 1080 in the event that CPU consumption attributed to image encoder 170 exceeds the target. For example, by reducing the LOD of a wireframe model or reducing the frame rate for background scene content or by adjusting the anti-aliasing algorithm for line art, CPU resources attributed to image encoder 170 are lowered.

In step 1080 ("Generate LOD Hints from Encoder Metrics"), various hints are generated in order to increase efficiency of the encoder 170. An embodiment of step 1080 is described as process 1100 below. Process 1000 proceeds to step 1082 ("Issue LOD Request") in which request 172 is issued by encoder 170 to graphics stack 120. In an alternative embodiment, select LOD adjustment requests are issued directly to GPU 160 via an API exposed to image encoder 170. In an embodiment, request 172 comprises a compilation of LOD and frame rate hints generated at step 1080, including a target frame rate for the encoded image transmission by pixel encoder 522. Such a target frame rate may be specified as a single value or a profile (e.g. maximum frame rate and average frame rate) which enables the graphics stack 120 to apply discretion on frame rate allocation for a 3D scene according to ROI priorities. In an embodiment, the request 172 further comprises predicted bpp (e.g. based on a previous frame) and target bpp values to the graphics stack 120 for different regions or on a per-frame basis and the graphics stack 120 optimizes the rendered 3D scene LOD accordingly.

Following step 1082, process 1000 proceeds to step 1090 ("Adjust Specified LOD According to Hints") in which image rendering operations performed by the GPU 160 are adjusted in response to hints from the image encoder 170. An embodiment of step 1090 is described as process 1200 below. Process 1000 proceeds from step 1090 back to step 1020 where the next frame is rendered by graphics stack 120 and GPU 160. If at step 1070, it is determined that process 1000 should terminate, process 1000 ends at step 1072.

Figure 11:
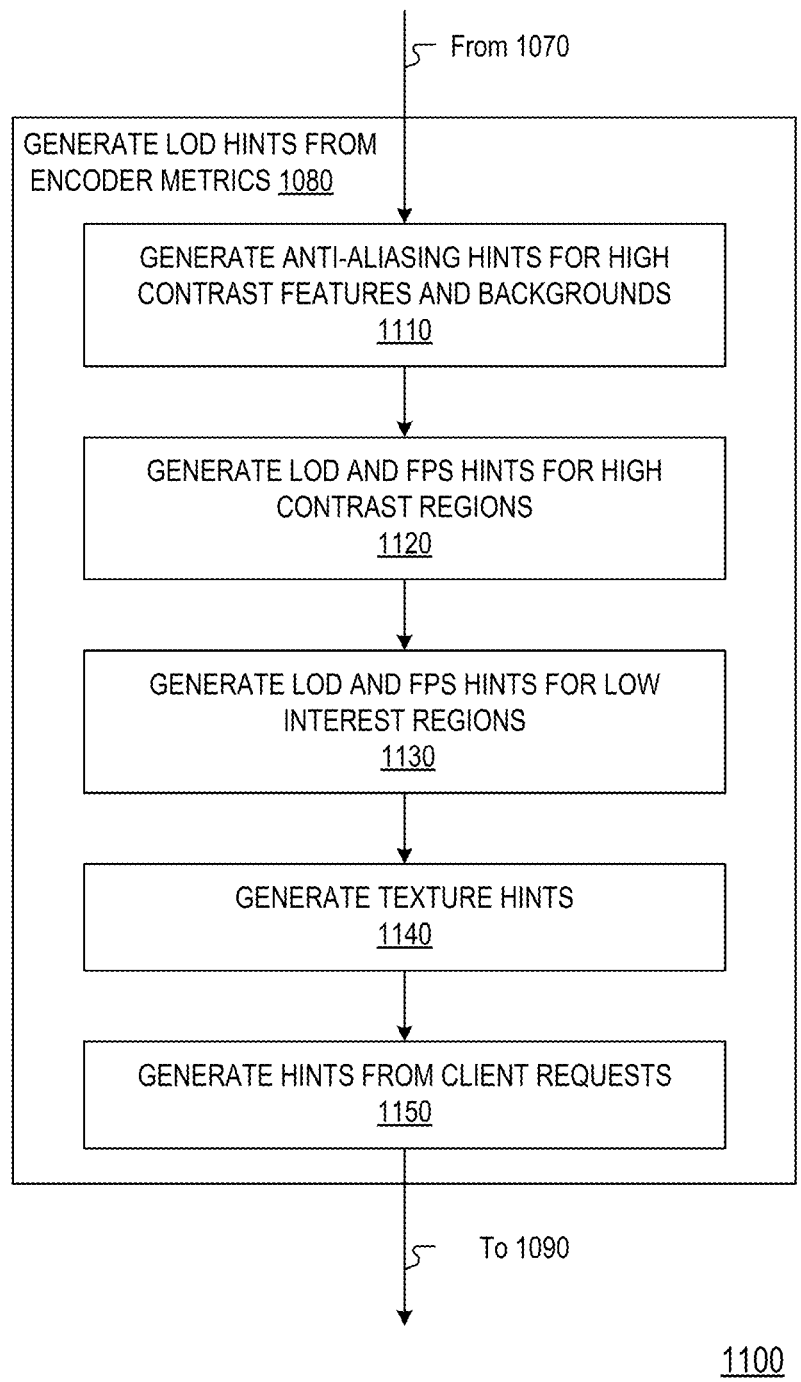
FIG. 11 illustrates a process for generating LOD hints from encoder metrics in accordance with exemplary embodiments.

FIG. 11 illustrates process 1100 for generating LOD hints from encoder metrics. Process 1100 is an embodiment of step 1080 in process 1000. At step 1110 ("Generate Anti-Aliasing Hints for High Contrast Features and Backgrounds"), encoder metrics generated at step 1040 identify high contrast image features with a poor compression ratio including high contrast lines, the edges of objects and rendered text. In some embodiments, such high contrast images features may be identified by image decomposition filters applied by classification function 520. The compression ratio of a high contrast region subjected to a lossless image encoder (e.g. a color cache encoder) is increased by decreasing the color count for the region. This is accomplished by ensuring: i) the pixels of a feature such as a rendered line or high contrast edge are of identical color or a limited color set (e.g. color quantized) ii) pixels that form the background to the feature are of an identical color or limited color set and iii) eliminating anti-aliasing effects to minimize the number of distinct colors of the feature and background to be encoded. Alternatively, if a feature is subjected to lossy encoding, color quantization is typically applied during encoding so adjusting anti-aliasing may provide little compression improvement. In one such embodiment, probe testing is employed to maximize the impact of anti-aliasing adjustments on compression ratio as described by process 1800 in which the image encoder 170 repeatedly submits requests for the graphics stack to adjust or disable anti-aliasing for a specified region or feature and monitors encoder metrics to achieve the highest compression ratio. In some embodiments in which graphics stack supports a library of anti-aliasing functions for soft edges of characteristically natural images (e.g. shadowed or overlapping facial features of a human model), the image encoder 170 requests experimentation with or improvement of such anti-aliased features with an objective to maximize 'smoothness' and minimize spatial frequency artifacts which contribute to decreased compression ratio of natural image regions.

At step 1120 ("Generate LOD and FPS Hints for High Contrast Regions"), the image encoder 170 identifies any recurrence of poor compression ratio (i.e. relatively high bpp) over a substantial proportion (e.g. 20%) of pixels comprising a rendered frame attributed to high contrast features such as lines and high contrast objects under motion. In an exemplary embodiment, the image encoder 170 generates LOD hints for the graphics stack to reduce the number, density and/or frame rate of high contrast features that are changed on each rendered frame, for example following a recurrence during which a substantial proportion of the display exceeds 1 bpp compression ratio.

At step 1130 ("Generate LOD and FPS Hints for Low Interest Regions"), the image encoder 170 requests reduced LOD and frame rate for low interest regions. In an embodiment, the image encoder 170 submits a generic request to reduce LOD and FPS and the graphics stack is tasked with effecting the LOD reduction according to region of interest priorities known to the graphics stack 120. In another embodiment, the image encoder 170 submits per-region encoder metrics to the graphics stack 120 in order for the graphics stack to prioritize selective reduction in LOD and frame rate by considering both the region of interest priorities known to the graphics stack 120 and compression ratio history for low priority regions such as scene backgrounds and small distant objects.

At step 1140 ("Generate Texture Hints"), the image encoder submits requests to the graphics stack to simplify, substitute or delay update rates for high complexity patterns with poor compression ratio.

At step 1150 ("Generate Hints from Client Requests"), the image encoder 170 generates hints based on requests received from the client 140 or attributes provided by the client 140 which are relayed to the graphics stack 120. In an exemplary embodiment the ambient brightness level at the client is used as a hint for the graphics stack 120 to quantize vertex and texture colors prior to subjecting the image to the image encoder. In another embodiment, the client specifies a visible display region which is a sub-section of the raster area specified for raster frame sequence 126. Image regions outside the visible display region are rendered at reduced LOD. In another embodiment, client gestures such as pinch, zoom or pan gestures provide an indication of pending changes to the visible display region which enables predictive changes to LOD at the perimeter to the sub-section. In another embodiment in which pinch and zoom gestures are supported by client side image scaling, the rendered frame rate and LOD are reduced while the image is being scaled at the client to increase responsiveness.

Figure 12:
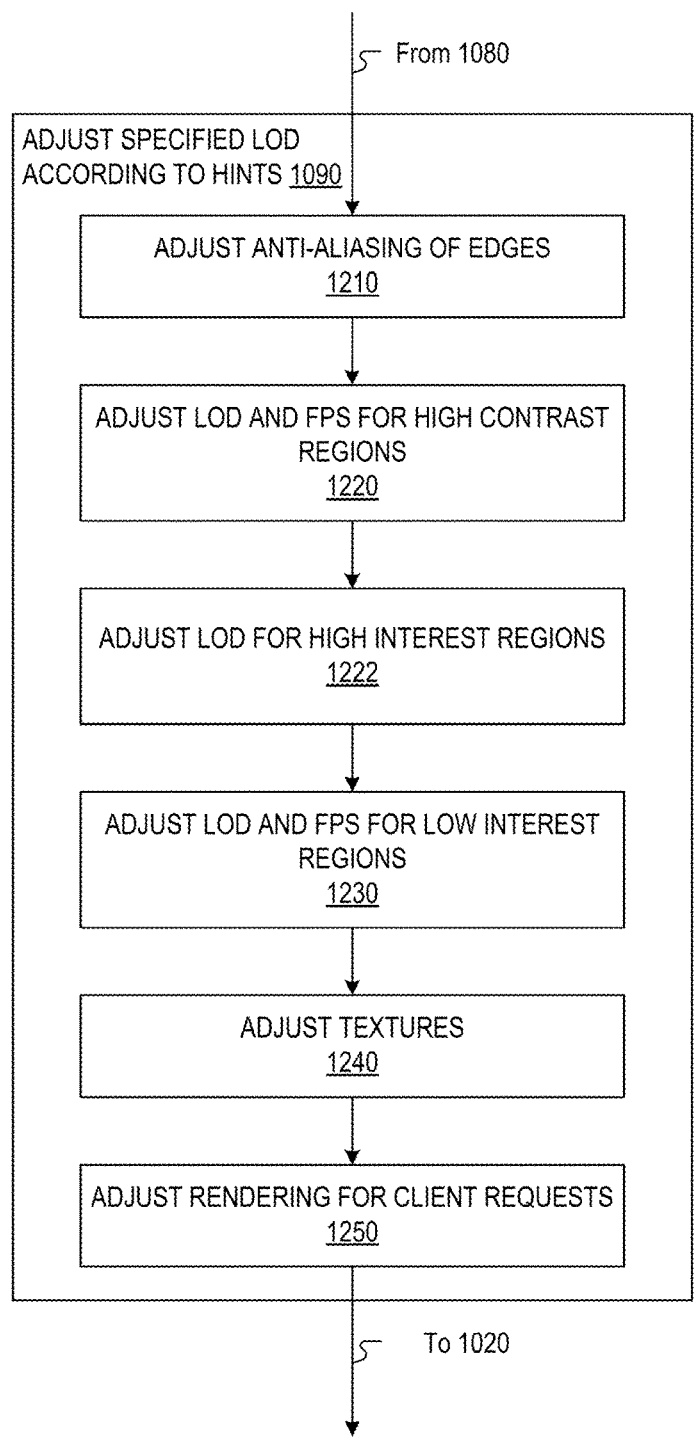
FIG. 12 illustrates a process for adjusting a specified LOD according to LOD hints in accordance with exemplary embodiments.

FIG. 12 illustrates process 1200 for adjusting a specified LOD according to LOD hints. Process 1200 is an embodiment of step 1090 in process 1000. In an embodiment one or more of the steps of process 1200 are executed by the LOD shader 340 responsive to requests 172, related draw commands issued by graphics stack 120 and depth information associated with raster pixels. In other embodiments, the graphics stack 120 modifies shading techniques and parameters to adjust the LOD using conventional draw commands and/or tailored functions such as using a geometry compression technique without explicit requirement for the LOD shader 340.

At step 1210 ("Adjust Anti-Aliasing of Edges"), anti-aliasing filtering of foreground wireframe lines on flat shaded backgrounds is disabled in response to a related LOD reduction request for an image region targeted for lossless encoding. In an embodiment, additional anti-aliasing adjustments are made to background lines and edges between overlapping textures as described by process 2300.

At step 1220 ("Adjust LOD and FPS for High Contrast Regions"), color gradients of background regions in proximity to edges are quantized to aid direct lossless encoding of the high contrast feature at improved compression ratio. In the case of a wireframe CAD model, image spatial detail is decreased during periods of rapid motion or high interactivity by at least one of i) applying real-time geometry compression (e.g. vertex decimation or mesh simplification techniques) to image primitives prior to rasterization, ii) using a multi-resolution approach and switching to a lower resolution model iii) using progressive mesh techniques or iv) 'viewport culling' i.e. reducing the detail of a model by limiting the depth of the far clipping plane thereby reducing the view frustum. If the render rate or rasterized image complexity of frame sequence 126 is reduced, the resultant bandwidth surplus is utilized to increase the LOD again. In an embodiment, the view frustum is segmented into depth regions (e.g. foreground, middle distance and background) and primitives within each depth region are assigned a different maximum frame update rate. Foreground objects are updated at the highest frame rate and background objects such as background terrain are updated at a reduced rate. In an embodiment, the color count of a high contrast region is decreased by applying color quantization to vertices and textures, for example using a limited set of colors when shading or blending fragments into pixels.

At step 1222 ("Adjust LOD for High Interest Regions"), the spatial detail of high interest shaded or illuminated objects (e.g. foreground objects or objects under motion) is adjusted for optimum lossy compression at the transmission frame rate indicated by requests 172. Rather than decreasing the LOD to sustain a high render rate of objects under motion, the original LOD of shaded objects is maintained or even increased at the expense of the rate for frame sequence 126 because high LOD shaded objects are smoother (i.e. fewer spatial frequency artifacts) and encode more efficiently than comparable low LOD shaded objects.

At step 1230 ("Adjust LOD and FPS for Low Interest Regions"), color quantization is applied to lightly shaded or low contrast background regions which assists decomposition of foreground features, particularly in the case of foreground wireframes which enables a higher portion of CPU or network bandwidth allocation to regions of high ROI (i.e. typically foreground features). In an embodiment, related vertices and primitives such as a set associated with a low ROI object (e.g. background object) are color quantized. Similarly, such objects may be subjected to flat vertex shading to reduce the absolute color count. In some embodiments, encoding efficiency and network bandwidth are improved by increasing the LOD of background features and objects such as the background terrain or distant objects of a computer game scene or geographic model. By increasing the LOD using a higher vertex density, rendered objects are smoothened in the spatial domain and consequently comprise fewer high frequency components in the transform domain (e.g. DCT or wavelet).

At step 1240 ("Adjust Textures"), additional encoding efficiencies are realized by selecting and applying smoother textures or less textural detail to object primitives or substituting high detail texture with low detail texture. In an embodiment, a reduced resolution mipmap image is applied to low ROI objects to increase encoding efficiency. In another embodiment, increased detail or edge enhancements are applied to foreground and high-motion objects to increase the contrast. In another embodiment, high contrast textures previously applied to a CAD model are adjusted to reduce the bpp cost. For example, line spacing or block size of repetitive pattern area-fills or hatch shading is increased to lower the bpp cost of encoding a shaded region. In an embodiment, LOD for a low ROI region is reduced by adjusting reflection properties of the associated texture. In a ray tracing embodiment, reflectivity is adjusted by directing fewer rays at a low ROI object such an object under motion or background object.

At step 1250 ("Adjust Rendering for Client Requests"), various hints provided by the client 140 are used by the graphics stack 120 to optimize rendering based on client attributes including display resolution and ambient brightness. In an embodiment, the resolution of frame sequence 126 is temporarily reduced in X and Y dimensions (e.g. ½ or ¼ the native resolution of display 142) when the frame rate difference computed at step 1050 is below target. The smaller frames are encoded at the reduced resolution and up-sampled to the desired native resolution by a decoder at client 140. In another embodiment, color quantization of low ROI regions are increased under high ambient lighting recorded by a client ambient lighting sensor and reported to host computer 110. In another embodiment, edge enhancements are applied to high ROI regions under high ambient lighting reported by the client 140. In another embodiment, the GPU 160 renders a sequence of key frames at a low frame rate during periods of client side gesturing as indicated via requests 172. The client 140 multiplexes the decoded sequence of key frame with locally-generated scaled images to provide a perceived continuous high frame rate during interaction. In another embodiment, the client 140 specifies a visible display region which is a sub-section of the raster area specified for raster frame sequence 126 and display areas outside the visible display region are rendered at reduced frame rate and/or reduced LOD.

Figure 13:
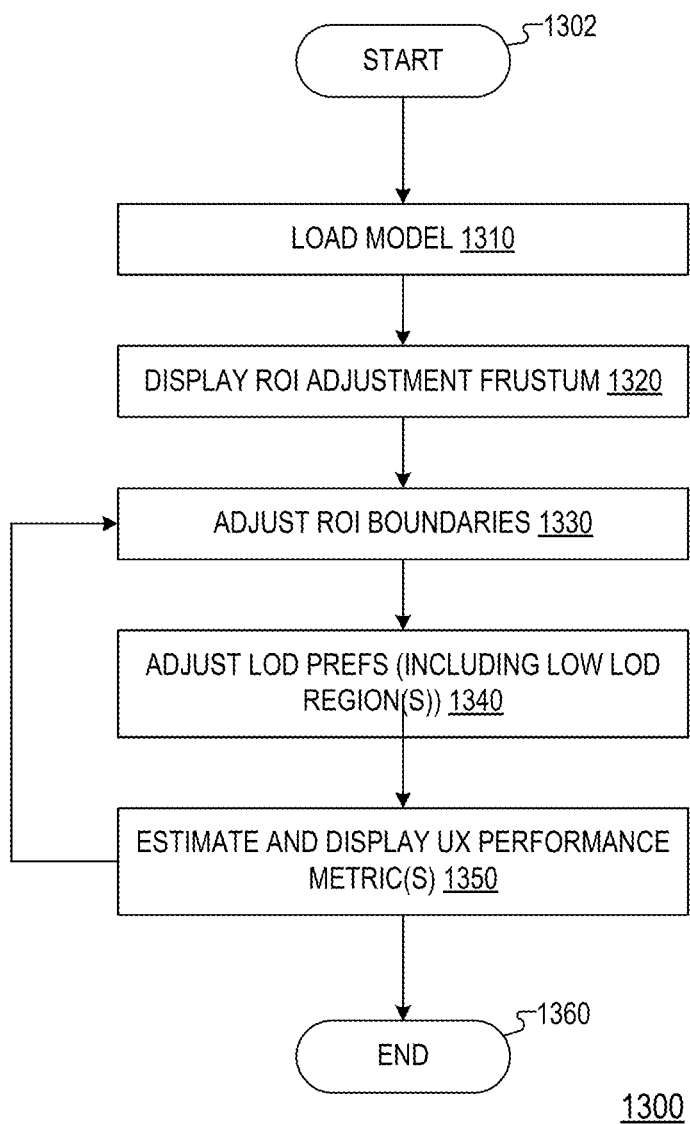
FIG. 13 illustrates a process executed for adjusting the LOD of select regions of a rendered frame sequence in accordance with exemplary embodiments.

FIG. 13 illustrates an embodiment of a process 1300 executed by processing resources 114 for adjusting the LOD of select regions of a rendered frame sequence. In an exemplary case, select regions of a CAD model such as the model 400 are designated as high ROI regions such as region 420 which enables productive interactivity with at least a portion of the model under resource constraint.

Process 1300 starts at step 1302 and proceeds to step 1310 ("Load Model") in which a three-dimensional model, e.g., model 400, is loaded. For example, the model 400 is a CAD wireframe model is loaded by application software from a storage device in one embodiment. At step 1320 ("Display ROI Adjustment Frustum"), the ROI adjustment frustum 430 is displayed, for example following activation by a software command or icon associated with the application software.

At step 1330 ("Adjust ROI Boundaries"), the area defined by the adjustment frustum 430 is shifted, enlarged or reduced to generate updated definitions for region 420 and reduced LOD region 410. Other approaches to selecting specific high ROI areas of a model 400 include selecting one or more component parts of the model from a component library (e.g. selecting the airplane 'tail section' from a library) or directly selecting vertices, primitives or components using a pointer tool. In an embodiment, lines in region 420 are color keyed by application software as a means to signal to image encoder 170 to encode the associated regions of frame sequence 126 at high priority (i.e. relatively high frame rate and high image quality compared to region 410) where the one or more values of the color key (associated with different quality levels or different ROI levels) are passed from 3D application 510 to image encoder 170 via 3D scene information 122. In another embodiment, an alpha channel associated with frame sequence 126 is used to convey the priority of region 420 as depicted by 3D scene information mask 2000. In such an embodiment, original vertices of a model are assigned quality or priority values either as predefined parameters integral to model definition or during runtime by graphics application software, these parameters are passed through the graphics pipeline (e.g. using an alpha channel or assigned vertex attribute) and presented to the encoder associated with the frame sequence 126 following viewport transformation.

In an embodiment, the high LOD region 420 is displayed in a separate application window associated with a second raster frame sequence. The raster image encoder processes the second raster frame sequence at increased quality and/or increased frame rate compared to the raster frame sequence 126. Such an approach enables the Graphics User Interface (GUI) of a CAD application to be segmented specifically to address the WAN interactivity and bandwidth challenges of remote application access. For example, one region of the GUI at client 140 (e.g. an application insert window or secondary display device) is designated as a navigation pane with high frame rate at reduced quality while a second region of the GUI at client 140 (e.g. the primary display device) is designated for detailed design work and displays a high quality raster image sequence at reduced frame rate. A method for communicating and composing separate application windows is disclosed in U.S. patent application Ser. No. 14/906,084 entitled "Composition Control Method for Remote Application Delivery" which is incorporated by reference in its entirely herein. In another embodiment, the entire model 400 is rendered at high LOD by default but switches to a low LOD rendering (and related increased frame rate and interactivity) in response to input such as keyboard command, voice command or gesture action from an human interface device such as a designated keyboard hotkey, microphone, touchscreen or gesture device. In another embodiment, the rear clipping plane of the primary view frustum for model 400 is adjusted to eliminate low LOD regions from view. For rapid accessibility, a keyboard hotkey may be assigned to toggling between the original dimensioned frustum and the reduced one.

Process 1300 proceeds to step 1340 ("Adjust LOD Preferences") in which behavior preferences under resource constraint are adjusted. Such preferences include adjusted anti-aliasing effects and frame rate parameters for high and low ROI regions (e.g. minimum frame rate specifications), blurring effects for low ROI regions, color quantization parameters (e.g. quantization limits), allowable texture and/or fragment shading operations (e.g. mipmap, flat shading or hatching optimizations) and geometry or mesh simplification rules (e.g. vertex culling limits for low LOD regions).

Process 1300 proceeds to step 1350 ("Estimate and Display UX Performance Metric(s)") in which performance metrics such as anticipated frame rate and interactive latency are estimated and displayed. In an embodiment, such an estimate is based on the measured network bandwidth availability for the remote desktop protocol 132 and a predicted encoded bpp for the loaded model 400 as constrained by the ROI boundaries configured at step 1330 and LOD preferences set at step 1340. In another embodiment, the estimate is based on a user-defined specification of the network 130. If or when, following step 1350, further adjustment to the ROI is warranted, process 1300 returns to step 1330 otherwise process 1300 ends at step 1360.

Figure 14:
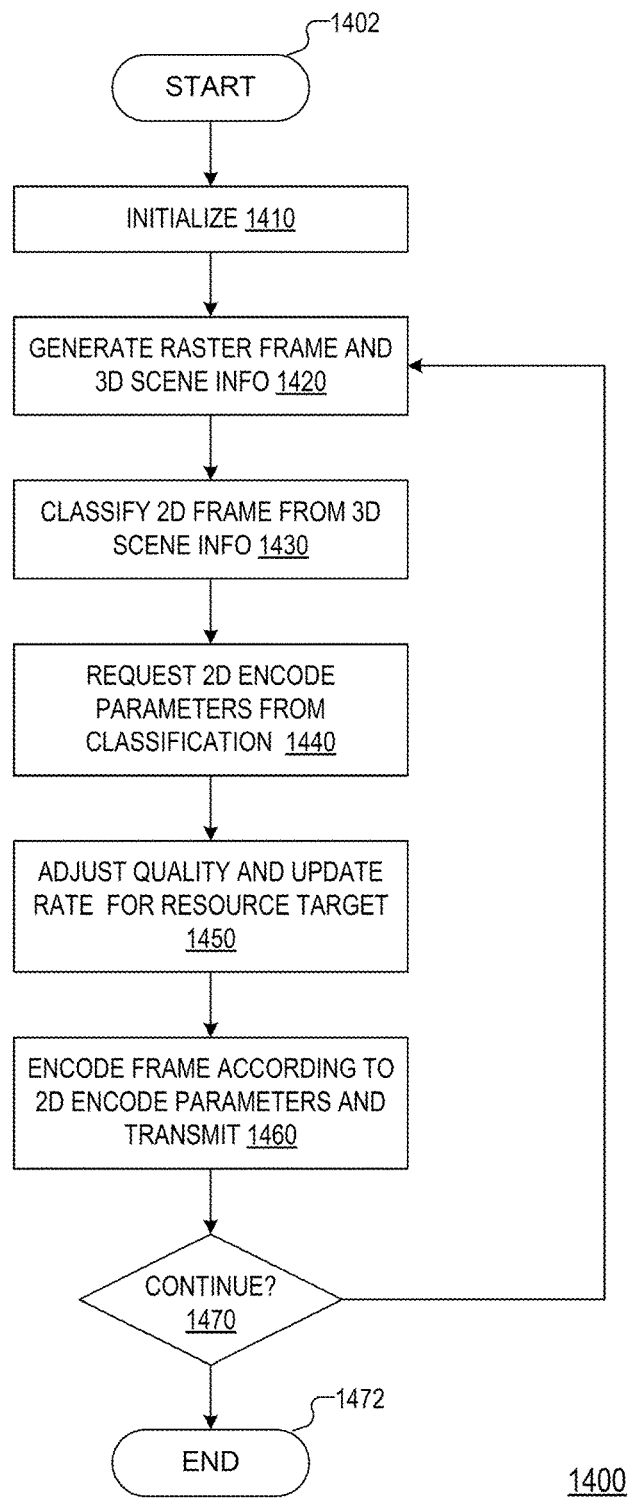
FIG. 14 illustrates a process for encoding a frame sequence based on 3D scene information determined during the rendering of the frame sequence in accordance with exemplary embodiments.

FIG. 14 illustrates an embodiment of a process 1400 executed by processing resources 114 for encoding a frame sequence 126 based on 3D scene information 122 determined during the rendering of the frame sequence. The process 1400 starts at step 1402 and proceeds to step 1410 ("Initialize") in which the image encoder 170 determines initial encoding parameters based on historic or policy-based quality settings for image quality- and frame rate targets and one or more resource targets including an initial target network bandwidth consumption, a host CPU utilization target and a client CPU utilization target.

Process 1400 proceeds to step 1420 ("Generate Raster Frame and 3D Scene Info"). Frame sequence 126 is generated by the graphics stack 120 and GPU 160. Each frame in the sequence may comprise a distinct set of buffers, each buffer comprising different content such as a first buffer comprising a characteristically natural image rendering, a second overlay buffer comprising a wireframe model rendering and a third overlay buffer comprising rendered text. The 3D scene information 122 is extracted at suitable stages of the rendering process (e.g. depth information is conveniently extracted by the graphics driver 514 from the viewport transform stage 320 and information such as content descriptors and camera motion hints are best extracted by the 3D Engine 512 or graphics driver 514). The 3D scene information 122 is stored in a location accessible to the image encoder 170 such as system memory 212 for a software implementation of image encoder 170 or graphics memory 216 if the raster image encoder is implemented as an add-on stage to the graphics pipeline.

Process 1400 proceeds to step 1430 ("Classify 2D Frame From 3D Scene Information") in which pixel classifications are derived from the 3D scene information 122. An embodiment of step 1430 is described as process 1500.

Process 1400 proceeds to step 1440 ("Request 2D Encode Parameters from Classification") during which target encoder 720, initial update priority value 730, minimum quality value 740 and refinement priority value 750 are requested based on the classification performed at step 1430. In an embodiment, a target encoder 720 is specified based on pixel depth and content descriptors. Text or line type pixels may be directed to a lossless encoder whereas characteristically natural image pixel regions (i.e. comprising many different color values and relatively low contrast gradients) may be directed to a lossy encoder or regions designated as shadowed may be subjected to encoding using a reduced color palette to preserve network bandwidth as exemplified in Table 2:

TABLE 2

| Content Descriptor | Depth | Encoder |
| --- | --- | --- |
| Text or wireframe | Foreground | Lossless |
| Text or wireframe | Background | Lossy |
| Natural, terrain, backdrop; motion blur; reflection | Foreground or background | Lossy |
| Shadow | Foreground or Background | Lossy - Cached color palette |

Initial update priority value 730 specifies the encoding priority for regions classified as recently changed based on ROI criteria. In an embodiment, ROI ranking of regions is provided explicitly via 3D scene information 122. E.g. model region 420 is explicitly ranked over region 410. In another embodiment, the ROI is derived from content depth information, interactivity feedback from the 3D application or derived from cursor location, scene change information, frame rate hints and/or content descriptors. Updates to related regions of a 3D scene (e.g. contiguous groups of pixel that form disparate parts of a model image) are synchronized by being assigned the same initial update priority value 730 and minimum quality value 740 to prevent tearing artifacts. Regions designated as occluded or unchanged pixels specified by a change mask need not be updated. Foreground regions of interest, regions supported by reliable motion vectors, regions designated with high frame rate (i.e. a short update period) or regions associated with high motion are encoded at the shortest available update interval while background regions, those relatively far from the near clipping plane or regions of low motion are encoded at an increased update period i.e. an encoded update for the region in the frame sequence 126 may be skipped in one or more frames. In an embodiment, scene markers are used to aid the determination of initial update priority. If a large 2D image change is presented in frame sequence 126 (e.g. a new object on scene or large change in perspective) in conjunction with a pending 'end of scene' hint from the graphics stack 120, the initial update priority for changed regions is set to a low value which minimizes the encoding and transmission latency in presenting a subsequent new scene.

Minimum quality value 740 specifies the minimum quality for regions based on ROI criteria. For example, under resource constraint, text content comprising a surface normal that is perpendicular to the viewing plane is encoded at high quality (e.g.) at least a perceptually lossless quality value while the quality of oblique text may be set in relation to the angle of the text surface normal due to the text becoming increasingly difficult to comprehend. As another example, identified regions of interest and foreground objects are encoded at high quality while pixels associated with background objects, motion blur, reflections, shadows, anti-aliased edges or ephemeral objects (e.g. explosion particles in a compute game) are encoded at reduced initial quality. Table 3 specifies three minimum quality levels for an exemplary set of classified content:

TABLE 3

| Content Classification | Minimum Quality |
| --- | --- |
| Foreground orthogonal text | High ROI, High Quality |
| Foreground wireframe (Interactive region) | |
| Foreground characteristically natural object | |
| Foreground object - low velocity | |

TABLE 3-continued

| Content Classification | Minimum Quality |
| --- | --- |
| Oblique text | Medium ROI, Medium Quality |
| Foreground wireframe (Non-Interactive region) | |
| Background characteristically natural object (large) | |
| Foreground object - medium velocity | |
| Terrain, backdrop; motion blur; reflection, shadow | Low ROI, Low Quality |
| Background wireframe | |
| Background characteristically natural object (small) | |
| Foreground object - high velocity | |

In an interactive computer game embodiment, pixels associated with projectile objects, player objects and enemy objects are assigned a high minimum quality while prop objects are assigned a medium minimum quality and the background is assigned a low minimum quality. In some embodiments, the ROI ranking and associated minimum quality is derived from 3D scene history information. In a CAD example, the interactive portion of a model has a high ROI ranking which decays over time (e.g. the minimum quality value 740 decays from high to low over a 30 second period) after an alternative portion of the model has been selected for interaction. The 3D scene information 122 presents coordinates and decay parameters for previously interesting regions. Similarly, regions related to objects newly arrived in a scene are assigned a high ROI ranking which may decay as new objects are presented. Alternatively, it is more efficient to sustain the quality of high quality regions using motion vectors rather than allow the quality to decay in instances where the distortion between frames is limited.

Refinement priority value 750 is used in conjunction with progressive pixel encoding. In an embodiment, a refinement priority value is requested based on content descriptors and or velocity information. For example, pixels associated with ephemeral content, high velocity objects or pixels subjected to motion blur effects are assigned a low refinement priority whereas pixels associated with a low velocity object are assigned a medium refinement priority and pixels associated with text, wireframes or interactive regions are assigned a high refinement priority. In another embodiment, refinement priority is inversely proportional to the depth of a region from the near clipping plane.

Process 1400 proceeds to step 1450 ("Adjust Quality and Update Rate for Resource Target") in which the encode quality and update interval for regions of the candidate 2D frame are adjusted from requested values according to CPU, GPU and/or network target bandwidth limits. An embodiment of step 1450 is described as process 1600.

Process 1400 proceeds to step 1460 ("Encode Frame According to 2D Encode Parameters and Transmit") in which the one or more buffers associated with the candidate encode frame of frame sequence 126 are encoded by pixel encoder 522 or skipped if unchanged or subject to frame subsampling. The encoded frame sequence is transmitted to client 140 via remote desktop protocol 132.

Process 1400 proceeds to decision point 1470 ("Continue?"), following which process 1400 returns to step 1420 when additional frames should be processed or ends at step 1472, for example if the remote desktop protocol 132 is terminated.

Figure 15:
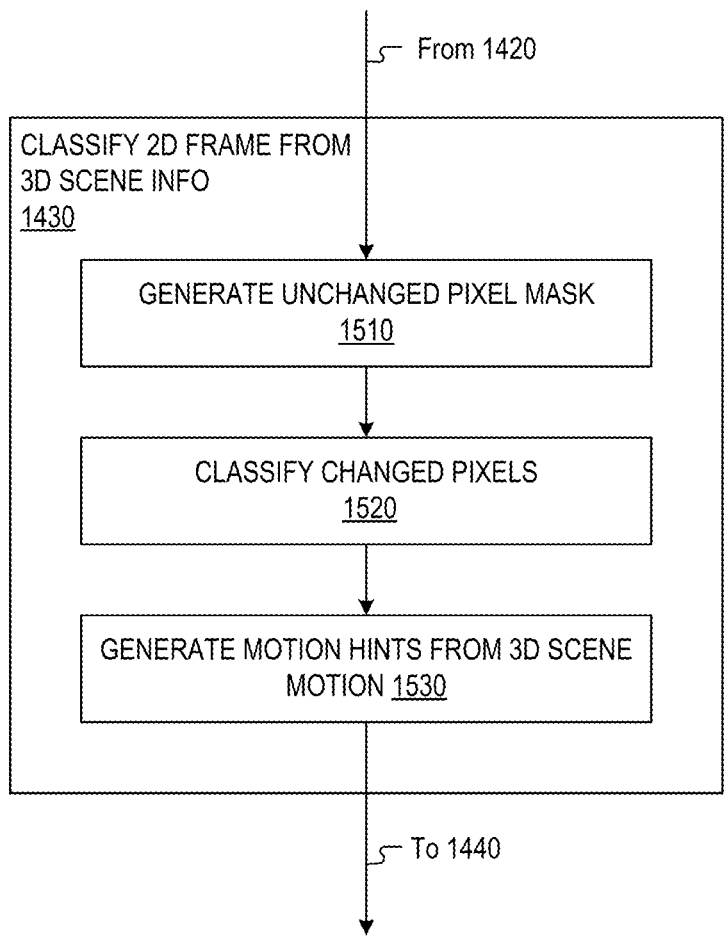
FIG. 15 illustrates a process for classifying a 2D frame from 3D scene information in accordance with exemplary embodiments.

FIG. 15 illustrates process 1500 for classifying a 2D frame from 3D scene information in accordance with exemplary embodiments of the present invention. Process 1500 is one embodiment of step 1430. At step 1510 ("Generate Unchanged Pixel Mask"), pixels in the candidate frame of sequence 126 that have not changed since being encoded in a previous frame are flagged and not encoded. In different embodiments, an unchanged pixel mask is generated by the GPU 160 and updated by image encoder 170 (which may be operating at a reduced frame rate) or generated directly by the image encoder 170 using a frame comparator. In an embodiment, the graphics stack 120 controls the encoded frame rate of select objects within the 3D scene by rendering a complete frame (in which typically the large majority of pixels of the frame are changed) and on a periodic basis selectively masking some of the changed pixels as unchanged (e.g. pixels associated with distant objects, ephemeral objects or background terrain). The masking interval is varied for different objects in the 3D scene according to ROI importance. The periodically masked regions are encoded at one or more reduced frame rates compared to the unmasked regions.

At step 1520 ("Classify Changed Pixels), changed pixels are classified according to the pixel depth from the near clipping plane and related object size as recorded by depth information 640. In some embodiments, individual pixels or regions are labeled according to content descriptors, velocity, ROI information and other attributes 650. If 3D scene information 122 is presented at a different scale to the native region definition(s) of pixel encoder 522, parameters are remapped to the region granularity of image encoder 170 (e.g. 16×16 pixel macroblock) which in an embodiment, comprises selecting minimum, maximum or average values such as depth or velocity values or applying a voting mechanism to select a predominant content descriptor.

At step 1530 ("Generate Motion Hints from 3D Scene Motion"), regions of pixels such as macroblock regions are identified as candidates for copying reference pixels from a different location in a previous frame based on camera position change or 3D object movement. Such motion hints may be accompanied with secondary indicators such as ROI criteria, surface normal values and depth information for the reference block which provide confidence levels for pixel correlation between the reference image and the current image.

In an alternative embodiment, select 3D scene information such as camera motion information is communicated to the client 140 and used by the client in conjunction with surface normal information to composite shifted pixel updates at low resource cost, using geometric predictions for example. In another alternative embodiment, select 3D scene information such as assembly instructions for compositing overlays are communicated to the client 140 and used by the client in conjunction with separately received overlay buffers (e.g. fonts, primitives or encoded text pixels) to render and compose overlay images. Process 2200 in FIG. 22 describes a process for client image composition.

Figure 16:
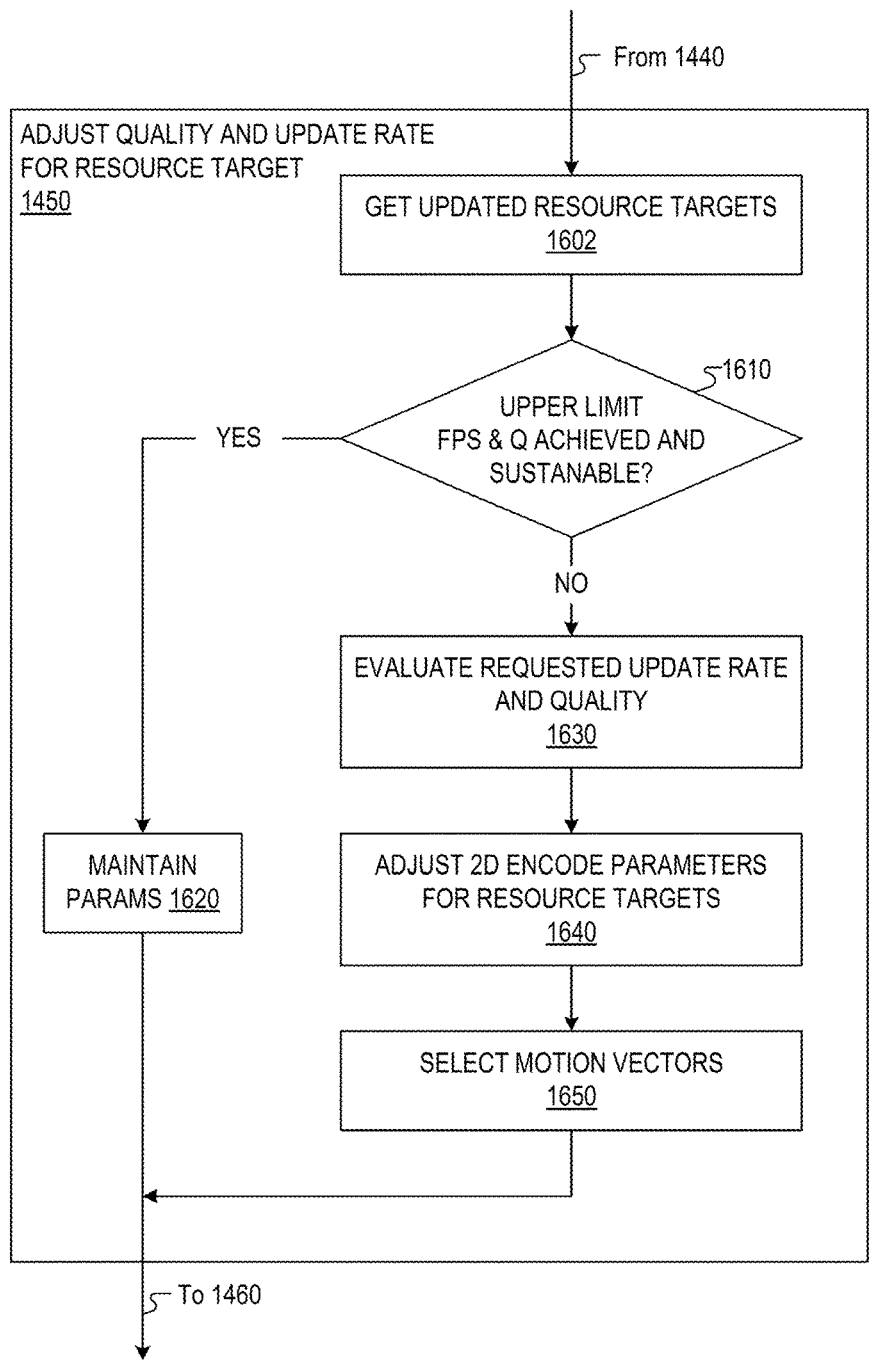
FIG. 16 illustrates a process for adjusting image quality and update rate for a resource target in accordance with exemplary embodiments.

FIG. 16 illustrates process 1600 for adjusting image quality and update rate for a resource target in accordance with exemplary embodiments. Process 1600 is an embodiment of step 1450 in process 1400. At step 1602 ("Get Updated Resource Targets"), latest values for host CPU, client CPU and network bandwidth targets are acquired. In an embodiment, the available network bandwidth is acquired from bandwidth manager 524, client CPU availability is acquired from the client 140 and host CPU availability is acquired from underlying performance monitoring services of host computer 110. In some embodiments, resource target constraints are also set according to administrative policies.

Process 1600 proceeds from step 1610 ("Upper Limit FPS and Image Quality Achieved and Sustainable?") to step 1620 ("Maintain Parameters") and exits to step 1460 if remote desktop protocol 132 is operating at maximum image quality and maximum frame rate within the upper limits of CPU and network bandwidth constraints. 2D encoder parameters requested at step 1440 are maintained. If the upper limits of frame rate or quality are determined as unattainable at step 1610, process 1600 proceeds to step 1630 ("Evaluate Requested Update Rate and Quality"). Resource utilization requirements for the requested update rate and quality values for changed regions of the candidate encode frame are estimated based on: i) the number of changed pixels determined at step 1510, ii) the estimated number of changed regions based on the initial update priority value 730, iii) bpp estimates for the changed regions based on minimum quality value 740, progressive refinement priority value 750 and recorded bpp history and iv) host and client CPU utilization estimates. The requested resource utilization is compared to resource utilization targets determined at step 1602. An embodiment of a process for determining optimum image quality and frame rate for an image sequence based on resource target constraints is described in U.S. patent application Ser. No. 14/686,320 entitled "Resource-Aware Desktop Image Downsampling Method and Apparatus" which is incorporated by reference herein in its entirety.

Process 1600 proceeds to step 1640 ("Adjust 2D Encode Parameters for Resource Targets") in which 2D encode parameters 124 are adjusted upward or downward from the values requested at step 1440 to match the resource utilization targets determined at step 1602.

In an alternative embodiment to steps 1630 and 1640, a mean quality and frame update interval is determined for a candidate encode frame (e.g. based on encoding statistics of previously encoded frames) and the minimum quality is adjusted higher than the mean for the frame if the region is a low ROI and the minimum quality is adjusted lower than the mean for the frame if the region is a high ROI, where the high ROI regions and the low ROI regions are specified in the 3D scene information 122.

Process 1600 proceeds to step 1650 ("Select Motion Vectors") in which motion vectors 760 are selected based on confidence criteria including depth and surface normal changes between the reference region and the encoding candidate region. In a host CPU constrained environment, image encoder 170 favors the transmission of motion vectors derived from motion hints interspersed with encoded reference images for i) low ROI regions ii) distant regions (e.g. more than halfway between near and far clipping planes) and iii) nearby regions with surface normals approximately perpendicular to the near clipping plane. Such an approach negates the costly CPU overhead associated with motion search techniques of traditional video encoders or the image transform and entropy encoding overheads of frame-by-frame pixel compression. If CPU resource utilization is secondary to network resource utilization and image encoder 170 lacks traditional video encoder capabilities, image encoder 170 favors similar motion vector usage. In an embodiment, resource utilization is predicted at step 1630 for multiple scenarios and an optimum scenario selected. For example, a first scenario uses only high confidence motion hints (e.g. perpendicular surface normal), a second scenario uses motion hints for medium confidence motion hints (e.g. further including low ROI distant pixels in which a limited distortion due to perspective changes is tolerated) and a third scenario which further includes mid-distance object motion with higher distortion predicted. In another embodiment, confidence limits are controlled by policy settings. In an alternative embodiment, surface normal and depth information for target motion blocks is communicated to client 140 and used by the decoder services of client 140 to adjust the perspective of copied reference blocks to eliminate distortion due to changes in perspective between consecutive frames. In another alternative embodiment, camera motion vectors such as pan or rotate vectors are generated by graphics stack 120 and communicated to the client 140 in conjunction with difference values for the reference pixels (i.e. delta encoding of residual values) to compensate for scene motion and lighting changes. Process 1600 proceeds from step 1650 to step 1460.

Figure 17:
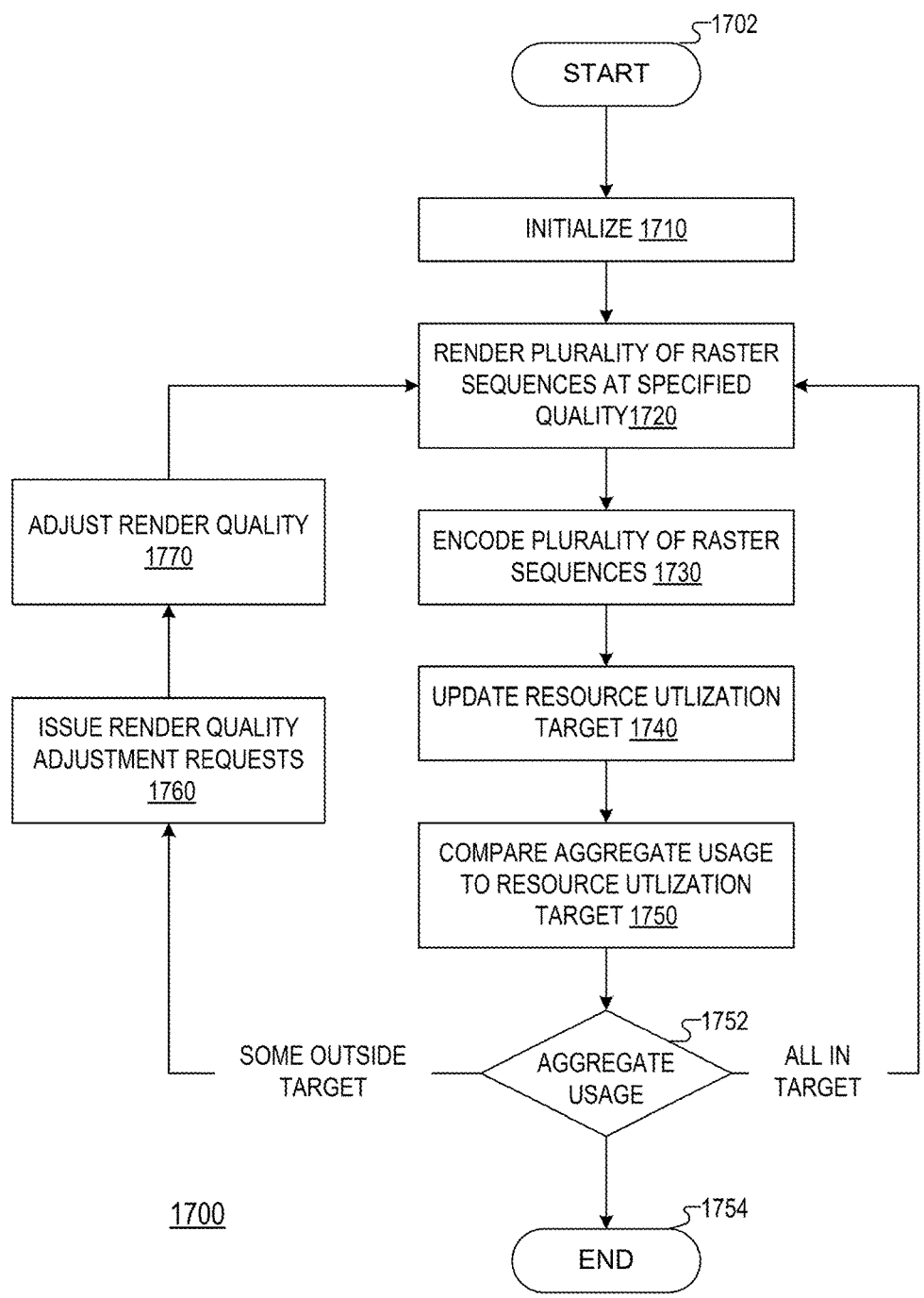
FIG. 17 illustrates a process for adjusting the render quality of concurrent raster sequences associated with concurrent image encoders in accordance with exemplary embodiments.

FIG. 17 illustrates an embodiment of a process 1700 executed by processing resources 114 of a system 800 comprising a plurality of graphics stacks 120 and image encoders 170 for adjusting the render quality of concurrent raster sequences associated with concurrent image encoders in accordance with exemplary embodiments. Process 1700 starts at step 1702 ("Start") and proceeds to step 1710 ("Initialize") in which configurable render settings of the plurality of graphics stacks 120 of system 800 are initialized, for example using default render quality i.e. render frame rate, LOD parameters, anti-aliasing settings, lighting, textures and rear clipping planes for objects associated with a prospective 3D image scene. In an embodiment, historic render frame rate and LOD settings are loaded on a per-stack basis based on a stored record of resource availability and administrative policies particular to each VM 820. As an example, administrative LOD policies may specify minimum and maximum LOD, quality or frame rate values on a per-user or per-VM basis. Such LOD policies may further specify allocation of network, CPU and GPU resources between users or VMs under constraint. Furthermore aggregate resource utilization targets may be specified for overall processor utilization of shared resources such as a shared CPU 150, shared network 130 or shared GPU 160. At step 1710, a target difference value (e.g. target percentage difference between the rendered frame rate of the sequence 126 and the encoded frame rate) or target profile (e.g. a mapped set of differences for different render rates) is set for each image encoder 170.

Process 1700 proceeds to step 1720 ("Render Plurality of Raster Sequences at Specified Quality") in which the current render quality specifications set at step 1710 or step 1770 are used to render the next frame for each graphics stack. Process 1700 proceeds to step 1730 ("Encode Plurality of Raster Sequences") in which the frames rendered at step 1720 are consumed by respective image encoders 170 for encoding and transmission to clients 140. Process 1700 proceeds to step 1740 ("Update Resource Utilization Targets") in which the target profiles and/or aggregate resource utilization specified at step 1710 are adjusted in the event of a policy change or a resource change (e.g. a network change) that demands either increased or decreased assertion of render quality changes.

Process 1700 proceeds to step 1750 ("Compare Aggregate Usage to Resource Utilization Target"), where, LOD load balancer 830 evaluates i) the difference between the frame rate of the raster sequence generated by the GPU and the encoded image update rate for each graphics stack and ii) the difference between aggregate resource utilization of CPU 150 and GPU 160 and their respective aggregate resource utilization targets.

If at step 1752, it is determined that individual and aggregate resource utilization is within target and that the encoded frame rate for each image encoder is within target of its respective render rate, process 1700 returns to step 1720. If at step 1752, it is determined that either an individual resource utilization or the aggregate resource utilization is outside target, process 1700 proceeds to step 1760 ("Issue Render Quality Adjustment Requests"). At step 1760, render quality adjustment requests 852 are generated for one or more VMs 820 in relation to the desired balance of resource utilization, for example by regulating the render frame rate for a particular graphics stack or issuing one or more of the LOD hints of process 1100. At step 1770 ("Adjust Render Quality"), recipient graphics stack(s) 120 respond to render quality adjustment requests 852 by adjusting frame rate or LOD parameters as described for process 1200. If at step 1752, it is determined that process 1700 should be terminated, process 1700 proceeds to step 1754 ("End") where process 1700 is terminated.

Figure 18:
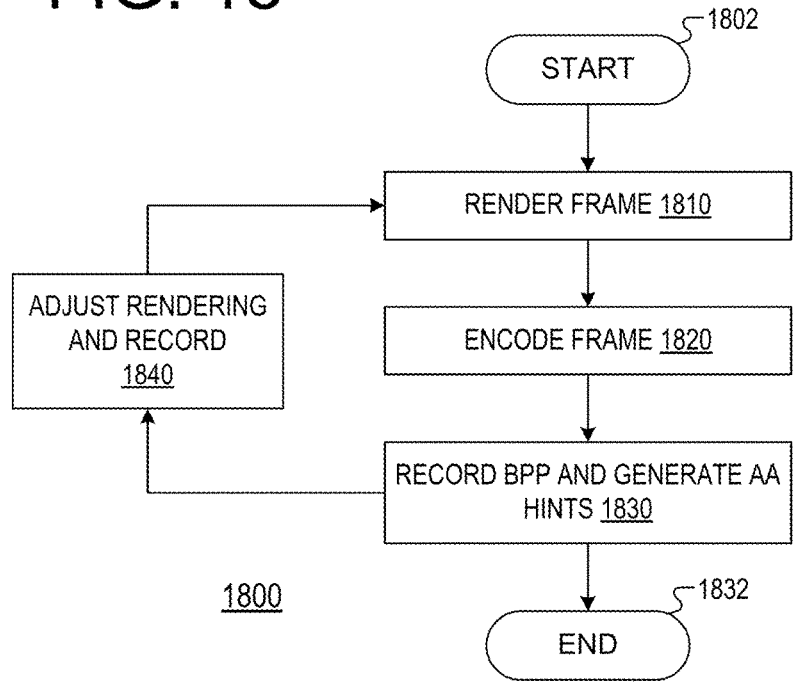
FIG. 18 illustrates an embodiment of a process for adjusting rendering parameters for anti-aliased text and lines based on active empirical probing in accordance with exemplary embodiments.

FIG. 18 illustrates an embodiment of a process 1800 executed by processing resources 114 for adjusting rendering parameters for anti-aliased text and lines based on active empirical probing in accordance with exemplary embodiments. Process 1800 starts at step 1802 ("Start") and proceeds to step 1810 ("Render Frame") in which a frame in sequence 126 is rendered. At step 1820 ("Encode Frame"), the frame rendered at step 1810 is encoded using lossy and/or lossless encoder settings. At step 1830 ("Record bits-per-pixel and generate anti-aliasing hints"), the per-pixel bit rate is recorded for regions of the frame identified for high quality encoding (e.g. text and line pixels as identified by an image classification filter) but further identified as comprising a high per-pixel bit rate (e.g. 1.0+ bpp). Hints are generated and submitted to graphics stack 120 that specify region co-ordinates and encoding efficiency for these regions. In various embodiments, the encoding efficiency is expressed in terms of bpp, pixels-per-second or other scale understood by the graphics stack 120.

At step 1840 ("Adjust Rendering and Record"), the graphics stack 120 records the encoding efficiency as provided by the image encoder 170 at step 1830 and the related anti-aliasing technique used to achieve the recorded performance. If the current spatio-temporal sample pattern impacts encoding efficiency, the graphics stack 120 adjusts the anti-aliasing technique (e.g. disable MFAA) or disables anti-aliasing entirely for regions identified as inefficient at step 1830 or switches from host-to-client rendered text and monitors for confirmation of an encoding efficiency improvement. Process 1800 returns to step 1810 in which the next frame is rendered using the changed settings. Such a feedback approach enables the graphics stack 120 to build a history of encoding efficiencies for different anti-aliasing techniques and apply content-dependent anti-aliasing. The process 1800 ends at step 1832 ("End").

Figure 19:
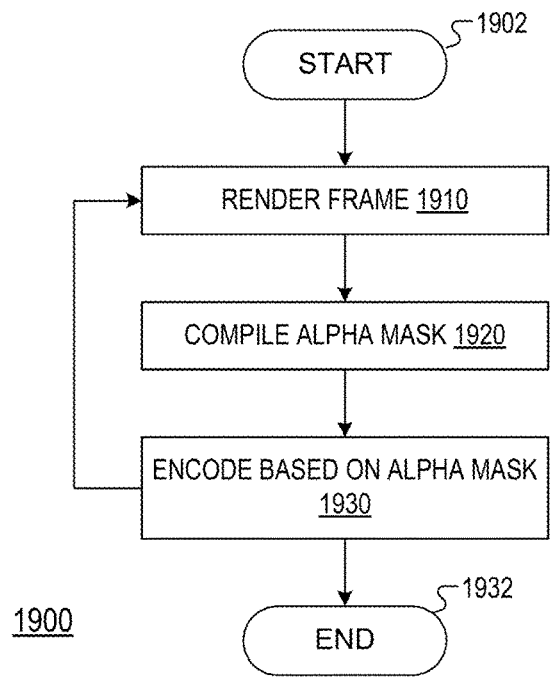
FIG. 19 illustrates an embodiment of a process for encoding a region based on 3D scene information conveyed from a GPU to an image encoder using an alpha channel of a frame buffer in accordance with exemplary embodiments.

FIG. 19 illustrates an embodiment of a process 1900 executed by a GPU 160 for encoding a region based on 3D scene information conveyed from the GPU to an image encoder using an alpha channel of a frame buffer in accordance with exemplary embodiments. Process 1900 starts at step 1902 ("Start") and proceeds to step 1910 ("Render Frame") in which a frame in sequence 126 is rendered in compatible 32-bit RGBA format. At step 1920 ("Compile Alpha Mask"), 3D scene information for the frame rendered at step 1910 is compiled and directed to the 8-bit alpha channel of the RGBA formatted frame. An embodiment of 3D scene information compiled as an 8-bit alpha channel for a region is depicted as scene information mask 2000 in FIG. 20. At step 1930 ("Encode based on Alpha Mask"), the frame generated at step 1910 is classified based on the alpha mask, encoded and transmitted as described for process 1400. Process 1900 proceeds to step 1932 where process 1900 ends.

Figure 20:
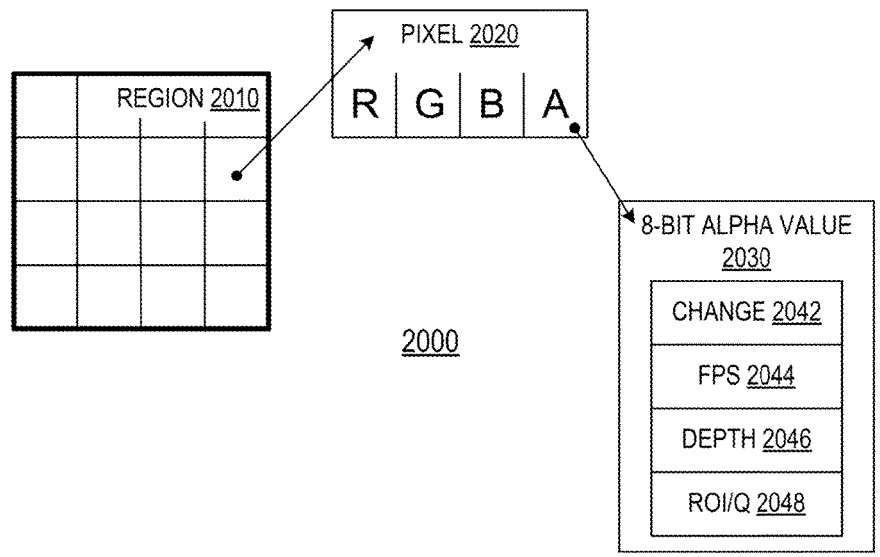
FIG. 20 illustrates an embodiment of a 3D scene information mask comprising scene attributes stored in frame buffer memory as alpha channel information in accordance with exemplary embodiments.

FIG. 20 illustrates an embodiment of a 3D scene information mask 2000 comprising scene attributes stored in frame buffer memory as alpha channel information in accordance with exemplary embodiments. In an alternative embodiment, such 3D scene information is composed in an independent frame. Region 2010 comprises a block or rectangle of pixels including exemplary pixel 2020. Pixel 2020 comprises at least R, G and B color values (typically 8-bits each but, in some embodiments may be higher resolution such as 12 or 16 bits each). Pixel 2020 also comprises alpha 'A' value 2030 which is generally the same resolution as each RGB value and used to convey 3D scene information from GPU 160 to image encoder 170. In some embodiment, each pixel in region 2010 comprises an alpha value populated with 3D scene information; in other embodiments, region 2010 is described by a representative subset such as one populated alpha value per region.

In an embodiment, change mask 2042 comprises a single bit value that flags whether the pixel 2020 (or the entire region 2010 in some embodiments) has changed since the region was last updated in the frame sequence 126. In an embodiment, the graphics stack 120 makes a determination whether or not changed pixels warrant encoding and sets change mask 2042 as 'unchanged' for low ROI pixels that have changed but need not be encoded. For example, such changed regions need only be encoded at a lower update rate compared to high ROI regions. Such an approach provides significant CPU and network bandwidth savings when encoding regions such as low light backgrounds or low light video with small color variations or camera shot noise or film grain effects. In an embodiment FPS value 2044 comprises a 2 bit value that specifies the desired frame update rate associated with a region. FPS value 2044 is used for bandwidth allocation performed by bandwidth manager 524 when an entire scene is under motion but different 3D primitives may be encoded at different frame rates, dependent on ROI criteria. In an embodiment, depth value 2046 comprises a 2 bit value that specifies depth for a region in a scene which enables image encoder 170 to perform bandwidth allocation based on primitive depth information. In another embodiment, depth value 2046 comprises a 3 or 4 bit value which biases the depth according to object size such that large distant objects are encoded at higher priority than small distant objects. In an embodiment, ROI or quality value 2048 is a 2-bit value that specified encoding quality for a pixel or region, such as perceptually lossless, high, medium and low quality values which provides an importance map of the rendered frame.

Figure 21:
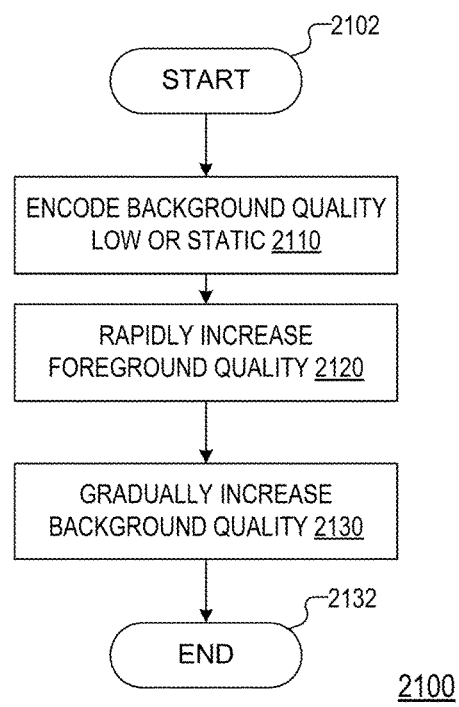
FIG. 21 illustrates a process for progressive refinement of image quality based on depth information in accordance with exemplary embodiments.

FIG. 21 illustrates an embodiment of a process 2100 executed by an image encoder 170 for progressive refinement of image quality based on depth value 2046 in accordance with exemplary embodiments. Process 2100 starts at step 2102 ("Start") and proceeds to step 2110 ("Encode Background Quality Low or Static") in which regions determined to be relatively far from the near clipping plane are encoded at a low image quality (i.e. highly quantized) and/or limited frame rate. At step 2110, the initial quality of foreground objects is set to at least the same quality as background objects and bandwidth permitting; foreground regions are set to a higher initial quality than background regions. At step 2120 ("Rapidly Increase Foreground Quality") foreground regions are progressively refined to a perceptually acceptable level for foreground regions using a high frame rate while background regions are maintained at a level determined at step 2110 using a reduced frame rate. At step 2130 ("Gradually Increase Background Quality"), background regions are gradually progressively refined to a perceptually lossless level for background regions at a rate dependent on resource availability or over a specified time period. If a 3D object associated with a foreground region undergoes motion, priority is given to maintaining the refined quality level of the new foreground region associated with the moved 3D object over further refinement of the background region. Process 2100 proceeds to step 2132 ("End") where process 2100 terminates.

Figure 22:
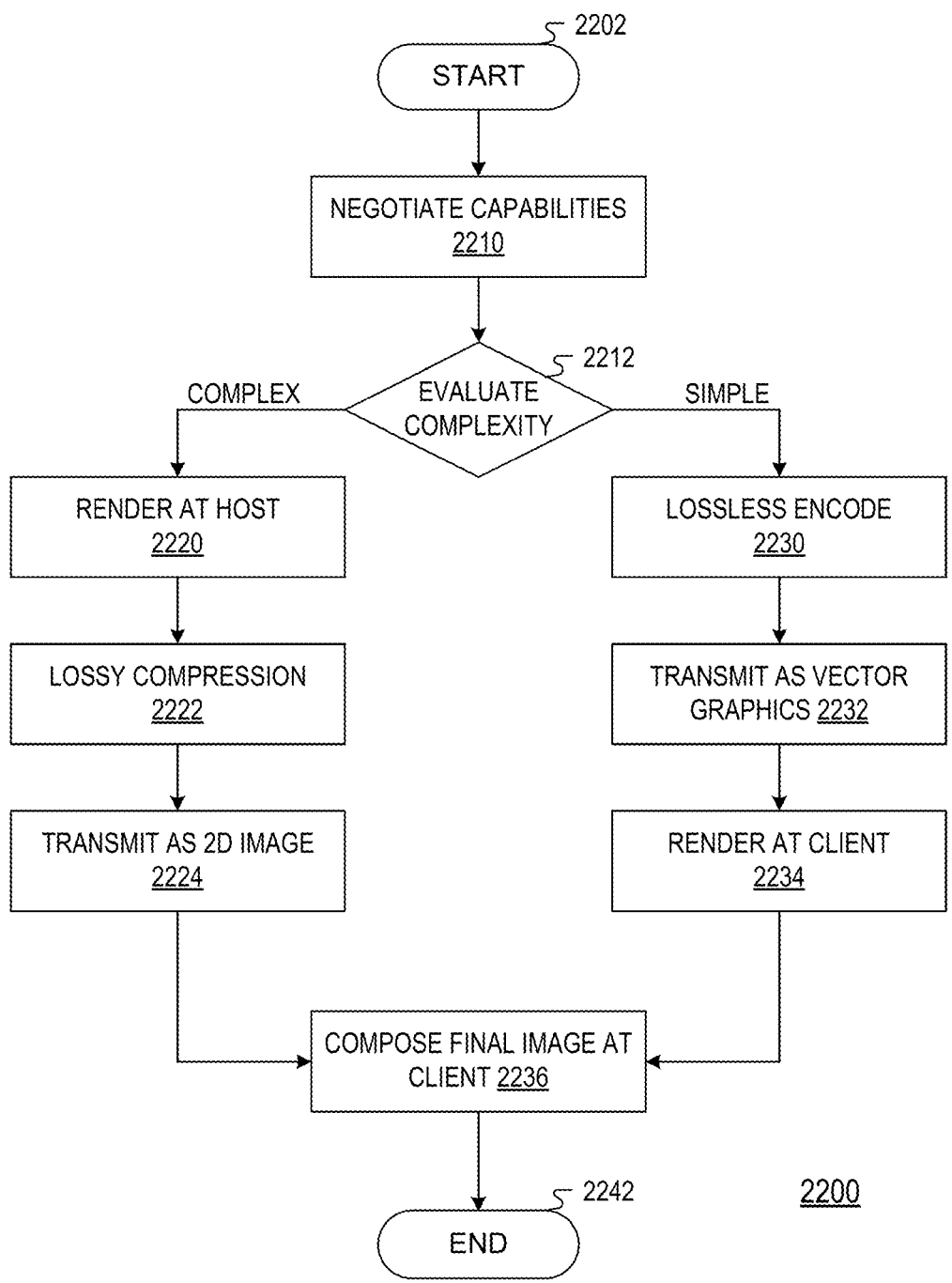
FIG. 22 illustrates a multi-stage rendering process in accordance with exemplary embodiments.

FIG. 22 illustrates a multi-stage rendering process 2200. Process 2200 starts at step 2202 and proceeds to step 2210 ("Negotiate Capabilities") in accordance with exemplary embodiments. In an embodiment, a graphics stack 120 negotiates a set of image encoding capabilities with an image encoder 170 and a set of client rendering and/or composition capabilities with a client 140. Multi-stage rendering is enabled if i) the image encoder is enabled for lossless encoding of vector graphics (e.g. vertices, lines, fragments and/or fonts) ii) the client 140 is enabled for at least simple rendering of these vector graphics or decoding of text masks, and iii) the client 140 is enabled to compose these resultant rendered images as overlays on a separately received host rendered frame sequence from the image encoder 170.

Process 2200 proceeds to step 2212 ("Evaluate Complexity") in which the combined rendering and encoding complexity for prospective frame sequence 126 is evaluated. Rendering of large sets of vertices subject to complex shading operations is more efficiently accomplished by GPU 160 compared to vector compression and transmission by image encoder 170 whereas rendering of text and wireframe overlays may be more efficiently accomplished by the client 140. In an embodiment in which the client 140 is enabled with an image composition function, text is rendered by CPU 150 or GPU 160, compressed by image encoder 170 and communicated to the client 140 as a compressed pixel-oriented image mask rather than vector graphics. If, at step 2212 it is determined that vector graphics are suited to host rendering, process 2200 proceeds to step 2220 ("Render at Host") in which GPU 160 renders designated complex objects and applies effects such as lighting, motion blur and anti-aliasing effects. At step 2222 ("Lossy Compression"), the rendered frame sequence is encoded using lossy compression techniques following which, at step 2224 ("Transmit as 2D Image") the image is transmitted as a lossy 2D image and decoded as a base image at client 140. In some embodiments, multiple base images are rendered in separate frame buffers at different z-depths (e.g. foreground and background) and transparency values are assigned to foreground pixels which are used by client 140 to overlay the foreground image(s) on the background image.

Content identified at step 2212 as suitable for simple overlay (e.g. fonts, block text or wire frame images with low number of vertices) or content suitable for storing at client 140 as cashed images, cached fonts or cached vector graphics are encoded at step 2230 ("Lossless Encode"), including encoding of overlay instructions and client anti-aliasing instructions. Encoded vector graphics are transmitted at step 2232 ("Transmit as Vector Graphics") following which they are rendered at step 2234 ("Render at Client").

At step 2236 ("Compose Final Image at Client"), the overlay(s) rendered at step 2234 are composed on the base 2D image transmitted at step 2224. Such composition includes performing client side anti-aliasing of text and line images. Following step 2240, process 2200 ends at step 2242 ("End").

Figure 23:
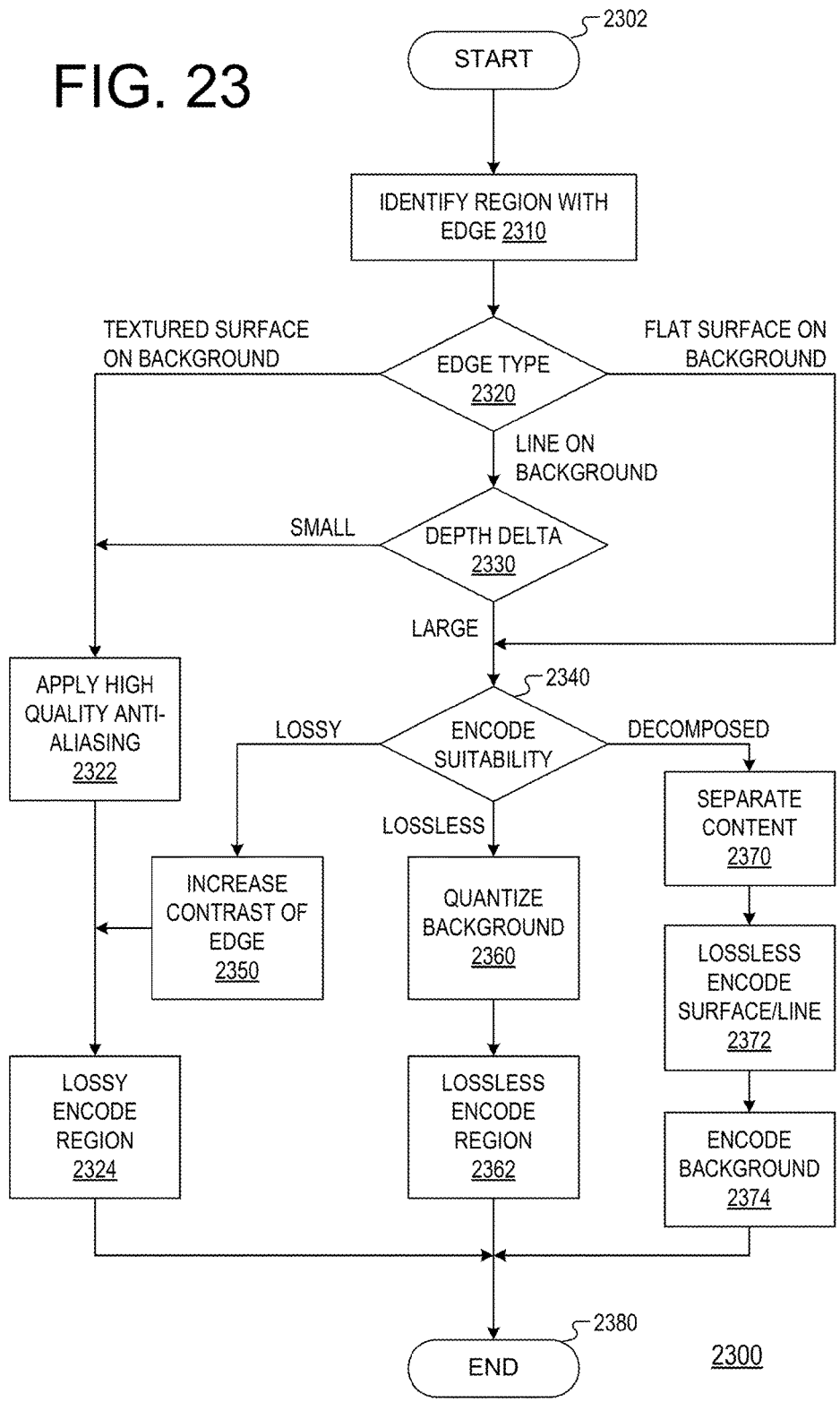
FIG. 23 illustrates a process for rendering and encoding edges of lines and surfaces based on depth information in accordance with exemplary embodiments.

FIG. 23 illustrates a process 2300 for rendering and encoding the edges of surfaces and lines based on depth information which minimizes the resource utilization inefficiencies associated with transmitting anti-aliased features in accordance with exemplary embodiments.

Process 2300 starts at step 2302 and proceeds step 2310 ("Identify Region with Edge") which in an embodiment, is performed by graphics stack 120 as a precursor to applying an anti-aliasing filter to a region. Process 2300 proceeds to step 2320 ("Edge Type") in which the type of edge is characterized. If at step 2320 it is determined that the edge comprises a textured surface (i.e. a surface comprising spatial detail) overlapping a background, process 2300 proceeds to step 2322 ("Apply High Quality Anti-Aliasing") in which an anti-aliasing filter is applied to the edge to blend the surface with the background. In an embodiment, a technique such as fast approximate anti-aliasing (FXAA) is applied to medium contrast features designated for lossy encoding to minimize spatial domain artifacts of edges. Such techniques may also be applied to single pixel and sub-pixel high contrast features to limit flicker as the features move from frame to frame. Process 2300 proceeds from step 2322 to step 2324 ("Lossy Encode Region") in which a lossy encoding technique is applied to the region prior to transmission to client 140.

If at step 2320, the edge comprises a line (e.g. wireframe line) on a background, process 2300 proceeds to step 2330 ("Depth Delta") where the distance between the line and the background is evaluated. If the distance is small (i.e. the line is relatively close to the background such as a distance of more than halfway between the near clipping plane and the background), the line is determined to be of low interest and process 2300 proceeds to step 2322 where anti-aliasing effects are applied to the line as a precursor to lossy encoding. By smoothing the line, lossy compression efficiencies are realized at the expense of a reduced render frame rate for the region at step 2324. If at step 2330, it is determined that the line is of high interest (i.e. a large distance between the line and the background), process 2300 proceeds to step 2340 ("Encode Suitability") in which the best encoding mode for the region is selected based on the capabilities of system 100 and the characteristics of the background. If, at step 2320, an edge type is determined to be a flat surface on the background (i.e. a solid color or limited color set), process 2300 also proceeds to step 2340.

If, at step 2340, it is determined that the region is suitable for lossy encoding, for example if image encoder comprises H.264 video encoding capabilities and protocol 132 is subject to severe network bandwidth constraint, process 2300 proceeds to step 2350 ("Increase Contrast of Edge"). At step 2350, a traditional edge enhancement technique such as local histogram equalization is applied to the edge and process 2300 proceeds to step 2324 where lossy encoding such as H.264 4:2:0 quantization is applied.

If, at step 2340, it is determined that the edge should be subjected 'to lossless encoding, for example based on a user preference of maintaining maximum quality, process 2300 proceeds to optional step 2360 in which the background is quantized (e.g. color quantization or decimation), following which process 2300 proceeds to step 2362 in which the region is subjected to lossless encoding. If, at step 2340, it is determined that the region should be subject to decomposed encoding, process 2300 proceeds to step 2370 ("Separate content") in which the background is rendered in a base framebuffer and the line or surface rendered in an overlay buffer, following which the line or surface is encoded using a lossless encoding technique at step 2372 ("Lossless Encode Surface or Line) and the background is separately encoded at step 2374 ("Encode Background") using a or lossless technique dependent on the background complexity. Process 2300 proceeds from step 2324, step 2362 or step 2374 to step 2380 ("End") where it ends.

FIG. 24 illustrates a process 2400 for displaying a rendered frame sequence based on dynamic LOD requirements submitted to a 3D application, graphics stack and/or an image encoder in accordance with exemplary embodiments. In an embodiment, such LOD requirements comprise at least one of i) rendered LOD ii) encoded image quality, iii) encoded frame rate or iv) interactive latency for a designated part of the displayed image.

Process 2400 starts at step 2402 and proceeds to step 2410 ("Determine LOD Requirements") in which LOD requirements are determined, for example via an explicit LOD request received by an application (e.g. hotkey or menu driven) or an indirect LOD request fed up the processing stack from client 140 via image encoder 170 to graphics stack 120 (e.g. a highlighted region of display 142 as determined by the client 140). Initial LOD requirements are loaded from memory based on administrative polices and learned usage preferences. In an embodiment, repeatedly requested LOD requirements determined at step 2410, such as frame rate preferences, render LOD specifications or quality preferences associated with particular software applications or application windows or content type (e.g. wireframe content) are accumulated and stored as leaned usage preferences.

Process 2400 proceeds to step 2420 ("Render Frame Sequence According to LOD Requirement") in which frame sequence 126 is rendered based on the LOD requirement. In an embodiment such as process 1300, explicit LOD preferences are used. In another embodiment such as process 1000, the LOD requirement is determined from feedback presented by image encoder 170 to graphics stack 120. In another embodiment, explicit LOD preferences are evaluated and modified to meet resource utilization constraints such as a network bandwidth limit, host CPU processing limit, client CPU processing limit or GPU processing limit.

Process 2400 proceeds to step 2430 ("Encode and Transmit Frame Sequence According to LOD Requirement") in which frame sequence 126 is encoded based on i) explicit requirements specified by the 3D application (e.g. a highlighted area of an application window designated for high quality encoding at a reduced frame rate or designated for reduced quality encoding at a high frame rate), ii) an LOD requirement derived from 3D scene information 122 or iii) an LOD requirement received from the client 140 (e.g. a hotkey or selected area of display 142). In an embodiment, an LOD requirement comprising quality, frame rate and render LOD parameters are stored as a user preference and retrieved by both graphics stack 120 and image encoder 170 in response to a hotkey event. The graphics stack 120 renders frame sequence 126 according to the LOD parameters and the image encoder 170 encodes the frame sequence 126 according to the same LOD parameters. The encoded frame sequence is transmitted to the client 140.

Process 2400 proceeds to step 2440 ("Decode and Display") in which the frame sequence transmitted at step 2430 is decoded by the client 140 and displayed. Process 2400 proceeds to step 2450 ("Continue") from where it either returns to step 2410 or ends at step 2452 ("End").

While the foregoing is directed to embodiments of the present invention, other and further embodiments of the invention may be devised without departing from the basic scope thereof, and the scope thereof is determined by the claims that follow.

The invention claimed is:

1. A method for rasterizing and encoding vector graphics, comprising:
 determining, by an image encoder, a difference between a transmission frame rate of an image encoder and a raster sequence frame rate of a raster sequence of images rasterized by a graphics processing unit (GPU); and
 adjusting, by the GPU, image detail of the raster sequence of images according to the difference.

2. The method of claim 1 wherein adjusting the image detail comprises decreasing a color count for a region.

3. The method of claim 2 wherein the color count for the region is decreased by eliminating anti-aliasing of a high contrast edge in the region.

4. The method of claim 2 further comprising:
 determining the region to be a low region of interest (ROI); and
 quantizing colors of the region.

5. The method of claim 4 wherein the region is determined as the low ROI from depth information associated with pixels in the region, the depth information derived from a viewport transform of the region.

6. The method of claim 2 wherein the color count is decreased on rendered frames of the raster sequence of images by a level of detail (LOD) shader function of the GPU.

7. The method of claim 2 wherein the color count is decreased by one or more of i) shading operations and ii) blending fragments into pixels using a limited set of colors.

8. The method of claim 1 wherein the adjusted image detail comprises reducing spatial detail for high contrast image features in the image detail.

9. The method of claim 8 wherein adjusting the image detail comprises: simplifying a wireframe image mesh in the image detail.

10. The method of claim 8 wherein the spatial detail for the high contrast image features is reduced in proportion to depth of the high contrast image features.

11. The method of claim 1 wherein adjusting the image detail comprises substituting a high detail texture with a low detail texture.

12. The method of claim 1 wherein adjusting the image detail comprises rendering a first object in the image detail at a reduced first update rate and a second object in the image detail of the raster sequence of images at a second update rate.

13. The method of claim 12 wherein the second update rate is equal to the raster sequence frame rate.

14. The method of claim 1 wherein the difference is compared to a target difference and adjusting the image detail is performed when the target difference exceeds a specified value.

15. The method of claim 1, wherein the image detail comprises a selected part of a rendered 3D model, and wherein adjusting the image detail comprises rendering the selected part of the rendered 3D model at a reduced LOD.

16. The method of claim 15 wherein the selected part comprises a set of vertices selected by a human interface device communicatively coupled with a computer aided design (CAD) software user interface (UI).

17. The method of claim 1 wherein adjusting the image detail comprises rendering at least part of a 3D image at reduced LOD responsive to the difference and input from a human interface device.

18. The method of claim 1 wherein adjusting the image detail comprises configuring an alpha channel for pixels in the image detail and encoding the pixels, by the image encoder in accordance with the configured alpha channel.

19. The method of claim 18, wherein the configured alpha channel comprises at least one of a quality value for an object or a depth value for the object.

20. An apparatus for rasterizing and encoding vector graphics, comprising:
 a graphics processing unit (GPU) that rasterizes a raster sequence of images at a raster sequence frame rate; and
 an image encoder coupled to the GPU by shared memory, the image encoder enabled to determine a difference between a transmission frame rate of an image encoder and the raster sequence frame rate,
 wherein the GPU adjusts image detail of the raster sequence of images according to the difference.

* * * * *